(12) United States Patent
Simoyama

(10) Patent No.: US 12,376,387 B2
(45) Date of Patent: Jul. 29, 2025

(54) SEMICONDUCTOR PHOTODETECTOR, RECEIVER, AND INTEGRATED OPTICAL DEVICE

(71) Applicant: FUJITSU OPTICAL COMPONENTS LIMITED, Kawasaki (JP)

(72) Inventor: Takasi Simoyama, Zama (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 485 days.

(21) Appl. No.: 17/750,935

(22) Filed: May 23, 2022

(65) Prior Publication Data

US 2023/0014187 A1 Jan. 19, 2023

(30) Foreign Application Priority Data

Jul. 19, 2021 (JP) ................. 2021-118455

(51) Int. Cl.
*G02B 6/12* (2006.01)
*G02B 6/122* (2006.01)
*H10F 10/17* (2025.01)
*H10F 77/12* (2025.01)
*H10F 77/20* (2025.01)

(52) U.S. Cl.
CPC ........... *H10F 10/17* (2025.01); *G02B 6/1223* (2013.01); *H10F 77/12* (2025.01); *H10F 77/20* (2025.01)

(58) Field of Classification Search
CPC ............... H01L 31/105; H01L 31/1055; H01L 31/00–208
See application file for complete search history.

(56) References Cited

U.S. PATENT DOCUMENTS 7,397,101 B1 7/2008 Masini et al.
2009/0237770 A1* 9/2009 Kim .................. G02F 1/025
359/279

(Continued)

FOREIGN PATENT DOCUMENTS

JP 2013-207231 10/2013
JP 2014-183195 9/2014
JP 2017-0112020 1/2017

OTHER PUBLICATIONS

Office Action dated Nov. 5, 2024 for Japanese Patent Application No. 2021-118455.

*Primary Examiner* — Eric A. Ward
(74) *Attorney, Agent, or Firm* — STAAS & HALSEY LLP

(57) ABSTRACT

A disclosed semiconductor photodetector includes a first semiconductor layer having a first refractive index and a first band gap; a second semiconductor layer formed on the first semiconductor layer, the second semiconductor layer having a second refractive index and a second band gap; a first electrode; and a second electrode. The second refractive index is greater than the first refractive index, and the second band gap is smaller than the first band gap. The first semiconductor layer includes a p-type first region, an n-type second region, and a non-conductive third region between the first region and the second region. The second semiconductor layer includes a p-type fourth region in ohmic contact with the first electrode, an n-type fifth region in ohmic contact with the second electrode, and a non-conductive sixth region between the fourth region and the fifth region.

16 Claims, 53 Drawing Sheets

FIRST DIRECTION ←→ SECOND DIRECTION

(56) References Cited

U.S. PATENT DOCUMENTS

| | | | |
|---|---|---|---|
| 2014/0138787 A1* | 5/2014 | Hellings | H01L 31/022408 257/432 |
| 2015/0108327 A1* | 4/2015 | Huang | H01L 31/03529 257/438 |
| 2017/0025562 A1 | 1/2017 | Knoll et al. | |
| 2021/0199888 A1* | 7/2021 | Takeda | H10F 77/206 |
| 2021/0288191 A1* | 9/2021 | Bian | H01L 31/022408 |
| 2022/0102574 A1* | 3/2022 | Takeda | H01L 31/105 |

* cited by examiner

FIRST DIRECTION ←→ SECOND DIRECTION

FIRST DIRECTION ←→ SECOND DIRECTION

FIRST DIRECTION ←→ SECOND DIRECTION

FIRST DIRECTION ◄──► SECOND DIRECTION

FIRST DIRECTION ←→ SECOND DIRECTION

FIRST DIRECTION ←——→ SECOND DIRECTION

FIRST DIRECTION ←——→ SECOND DIRECTION

FIRST DIRECTION ←→ SECOND DIRECTION

FIRST DIRECTION ←→ SECOND DIRECTION

FIRST DIRECTION ←→ SECOND DIRECTION

FIRST DIRECTION ←→ SECOND DIRECTION

FIRST DIRECTION ⟷ SECOND DIRECTION

FIRST DIRECTION ←→ SECOND DIRECTION

FIRST DIRECTION ←→ SECOND DIRECTION

FIRST DIRECTION ←——→ SECOND DIRECTION

FIRST DIRECTION ←→ SECOND DIRECTION

FIRST DIRECTION ◄──► SECOND DIRECTION

FIRST DIRECTION ←→ SECOND DIRECTION

FIRST DIRECTION ←—→ SECOND DIRECTION

FIRST DIRECTION ⟵⟶ SECOND DIRECTION

FIRST DIRECTION ←→ SECOND DIRECTION

SEMICONDUCTOR PHOTODETECTOR, RECEIVER, AND INTEGRATED OPTICAL DEVICE

CROSS-REFERENCE TO RELATED APPLICATIONS

The present application is based upon and claims the benefit of priority from the prior Japanese Patent Application No. 2021-118455 filed on Jul. 19, 2021, with the Japanese Patent Office, the entire contents of which are incorporated herein by reference.

FIELD

The disclosure discussed herein relates to a semiconductor photodetector, a receiver, and an integrated optical device.

BACKGROUND

As the need for computer throughput increases, expansion in the data transmission and reception bandwidth has been demanded. The data transmission in electrical signals is approaching its limits, and the application of optical signals is required. In order to efficiently convert optical signals to electrical signals, it is effective to integrate optical components into an electrical device for reducing transmission losses. In recent years, research and development in the field of silicon (Si) photonics, which forms various optical components on a silicon (Si) substrate, have been attracting attention.

RELATED-ART DOCUMENTS

Patent Documents

[Patent Document 1] U.S. Patent Application No. 2017/0025562
[Patent Document 2] U.S. Pat. No. 7,397,101
[Patent Document 3] Japanese Patent Application Laid-Open No. 2017-11020

SUMMARY

According to one aspect of the present disclosure, a semiconductor photodetector includes
a first semiconductor layer having a first refractive index and a first band gap;
a second semiconductor layer formed on the first semiconductor layer, the second semiconductor layer having a second refractive index and a second band gap;
a first electrode; and
a second electrode, wherein
the second refractive index is greater than the first refractive index, and
the second band gap is smaller than the first band gap, wherein
the first semiconductor layer includes
a p-type first region,
an n-type second region, and
a non-conductive third region between the first region and the second region, and
the second semiconductor layer includes
a p-type fourth region in ohmic contact with the first electrode,
an n-type fifth region in ohmic contact with the second electrode, and
a non-conductive sixth region between the fourth region and the fifth region, and wherein
the first region is located more toward the first direction in viewing from the third region,
the second region is located more toward a second direction opposite to the first direction in viewing from the third region,
the fourth region is located more toward the first direction in viewing from the sixth region,
the fifth region is located more toward the second direction in viewing from the sixth region, and
the third region and the sixth region overlap each other in a plan view.

The object and advantages of the embodiment will be realized and attained by means of the elements and combinations particularly pointed out in the claims. It is to be understood that both the foregoing general description and the following detailed description are exemplary and explanatory, and they are not restrictive of the invention, as claimed.

DESCRIPTION OF EMBODIMENTS

Various semiconductor photodetectors have been proposed for Si photonics; however, both high operating speed and high optical responsivity are desired for the proposed semiconductor photodetectors.

The present disclosure is intended to provide a semiconductor photodetector, a receiver, and an integrated optical device that is capable of achieving both high operating speed and high optical responsivity.

Of the optical components, a component that undergoes processing such as multiplexing-demultiplexing and modulation of light is required to have characteristics that do not absorb light in order to avoid excessive loss. However, a photodetector configured to convert an optical signal to an electrical signal (O/E conversion) is required to have characteristics that absorb light. Candidates for materials that meet these requirements include those having a combination of Ge used in an optical receiving portion with respect to near infrared light having a wavelength of 1.2 μm to 1.6 μm, and Si used in the other portion. This wavelength of near infrared light is transparent to Si, while the light is easily absorbed by Ge.

The photodetector, such as a photodiode (PD), includes a mechanism for extracting electrons and holes generated by optical absorption, i.e., photocarriers. An example of PD is a PIN PD. An example of a PIN PD is a homojunction PD having a Ge layer formed on a Si layer and two electrodes in ohmic contact with the Ge layer.

Another example of a PIN PD is a heterojunction PD having a Ge layer formed on a Si layer, at least one electrode in ohmic contact with the Si layer, and an electrical current path including a heterojunction interface between the Si layer and the Ge layer. In such a heterojunction PD, the presence of a valence band discontinuity at the heterojunction interface makes hole accumulation at higher light intensities, decreases transport speed, and reduces response characteristics. Decreased response characteristics will lead to bandwidth degradation of the receiver.

First Example

Figure 1:
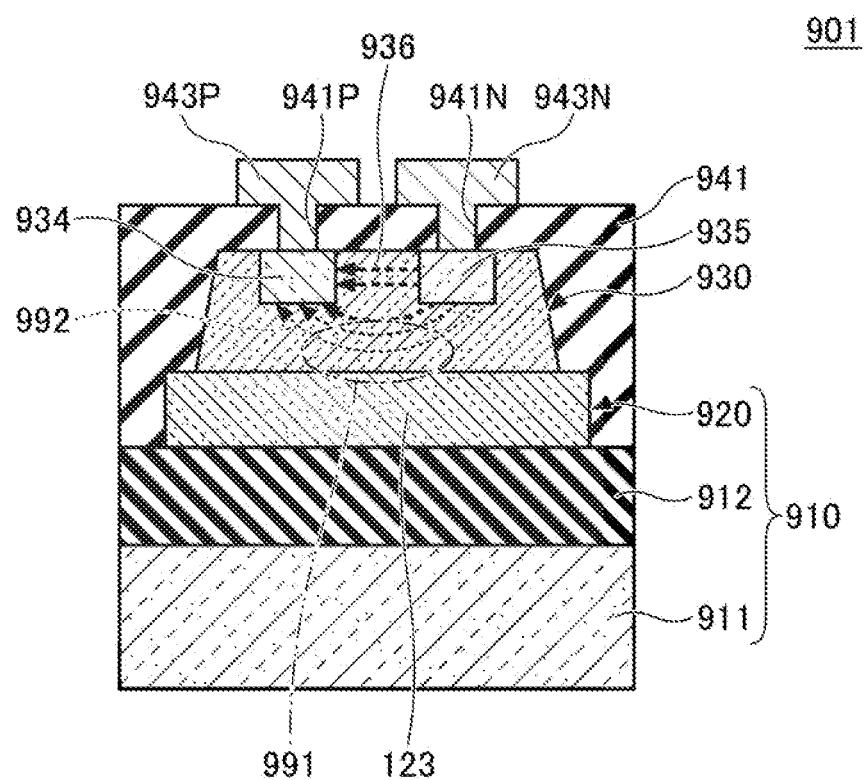
FIG. 1 is a cross-sectional view illustrating a configuration of a semiconductor photodetector according to a first example.

Here, a first example of a homojunction PD will be described. FIG. 1 is a cross-sectional view illustrating a configuration of a semiconductor photodetector according to the first example.

A semiconductor photodetector 901 according to the first example is fabricated on a SOI substrate 910. The SOI substrate 910 includes a silicon (Si) substrate 911, a Si oxide film 912 and a Si layer 920. A Ge layer 930 is formed on the Si layer 920. The Ge layer 930 has a p-type Ge region 934, an n-type Ge region 935, and a non-conductive i-type Ge region 936. The p-type Ge region 934 and the n-type Ge region 935 are formed on the top surface of the i-type Ge region 936. A portion of the i-type Ge region 936 is interposed between the p-type Ge region 934 and the n-type Ge region 935. In the first reference, the depth of the p-type Ge region 934 and the n-type Ge region 935 is less than one-half the thickness of the Ge layer 930.

A Si oxide film 941 is formed to cover a stack of the Si layer 920 and the Ge layer 930. An opening 941P reaching the p-type Ge region 934 and an opening 941N reaching the n-type Ge region 935 are formed in the Si oxide film 941. A metal film 943P, which is in ohmic contact with the p-type Ge region 934 through the opening 941P, and a metal film 943N, which is in ohmic contact with the n-type Ge region 935 through the opening 941N, are formed on the Si oxide film 941.

The semiconductor photodetector 901 thus configured has the Si layer 920 as an optical waveguide, and light propagating through the Si layer 920 enters the Ge layer 930 by evanescent optical coupling. Then, the propagated light 991 incident on the Ge layer 930 is absorbed by the Ge layer 930, and photocarriers are generated in the Ge layer 930. When an electric field 992 is generated between the n-type Ge region 935 and the p-type Ge region 934, and a reverse bias is applied through the metal film 943P and the metal film 943N to make the n-type Ge region 935 be at a higher voltage than the p-type Ge region 934, photocarriers are extracted. Note that in FIG. 1, the thicker the electric flux line illustrated by a dashed line, the stronger the electric field 992.

In the first example, as described above, each of the depths of the p-type Ge region 934 and the n-type Ge region 935 is less than one-half the thickness of the Ge layer 930. Thus, the region in which the intensity of the guided light 991 is high is separated from the p-type Ge region 934 and the n-type Ge region 935, and the electric field 992 in the region with high density photocarrier is weakened. Thus, the transport speed of the photocarrier is reduced, making it difficult to obtain a sufficient operation speed.

Second Example

Figure 2:
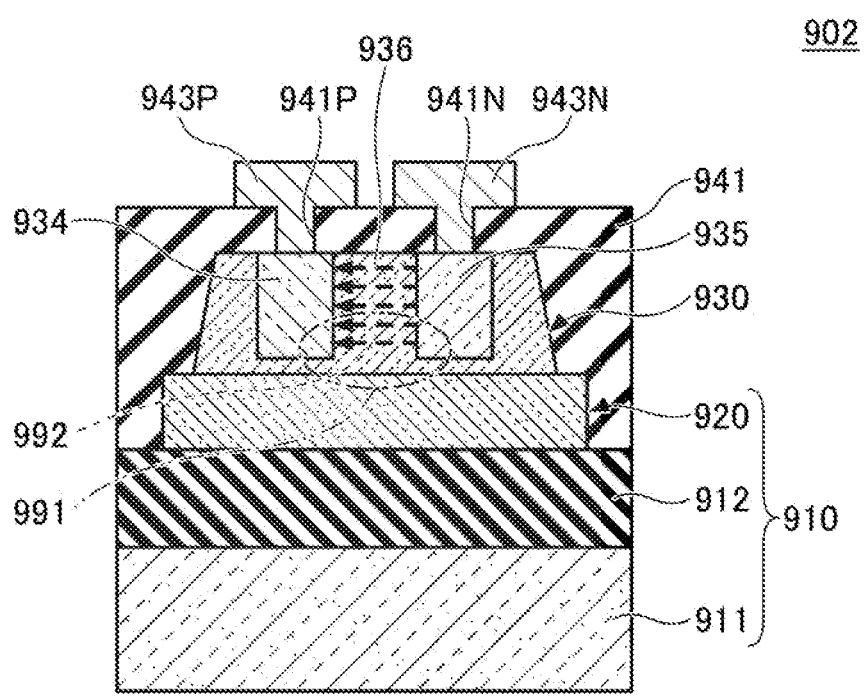
FIG. 2 is a cross-sectional view illustrating a configuration of a semiconductor photodetector according to a second example.

Next, a second example of a homojunction PD will be described. FIG. 2 is a cross-sectional view illustrating a configuration of a semiconductor photodetector according to the second example.

In a semiconductor photodetector 902 according to the second example, each of the depths of the p-type Ge region 934 and the n-type Ge region 935 is approximately 80% of the thickness of the Ge layer 930. Other configurations are similar to those in the first example.

In the second example, the region in which the intensity of the guided light 991 is close to the p-type Ge region 934 and the n-type Ge region 935, and the electric field 992 in the region with high intensity photocarrier is strong. Thus, it is easy to obtain high operating speed. However, the guided light 991 is also incident on the p-type Ge region 934 and the n-type Ge region 935, and free carrier absorption should occur. Unlike the optical absorption that generates new photocarriers, the free carrier absorption is optical absorption that provides kinetic energy to an existing carrier and does not contribute to an increase in electric current, so-called ineffective absorption. The greater the ineffective absorption, the lower the optical responsivity of light given by the ratio of the output current to the incident light intensity.

As described above, in the first example, it is difficult to obtain a sufficient operating speed, and in the second example, it is difficult to obtain a sufficient optical responsivity.

Thus, there may be much to be improved in the semiconductor photodetector 901 according to the first example and the semiconductor photodetector 902 according to the second example. Based on the above-described findings, the following embodiments have been proposed. Hereinafter, the embodiments will be described in detail with reference to the accompanying drawings. In the following description, the same or corresponding elements are given identical signs and duplicated descriptions may be omitted.

First Embodiment

Figure 3:
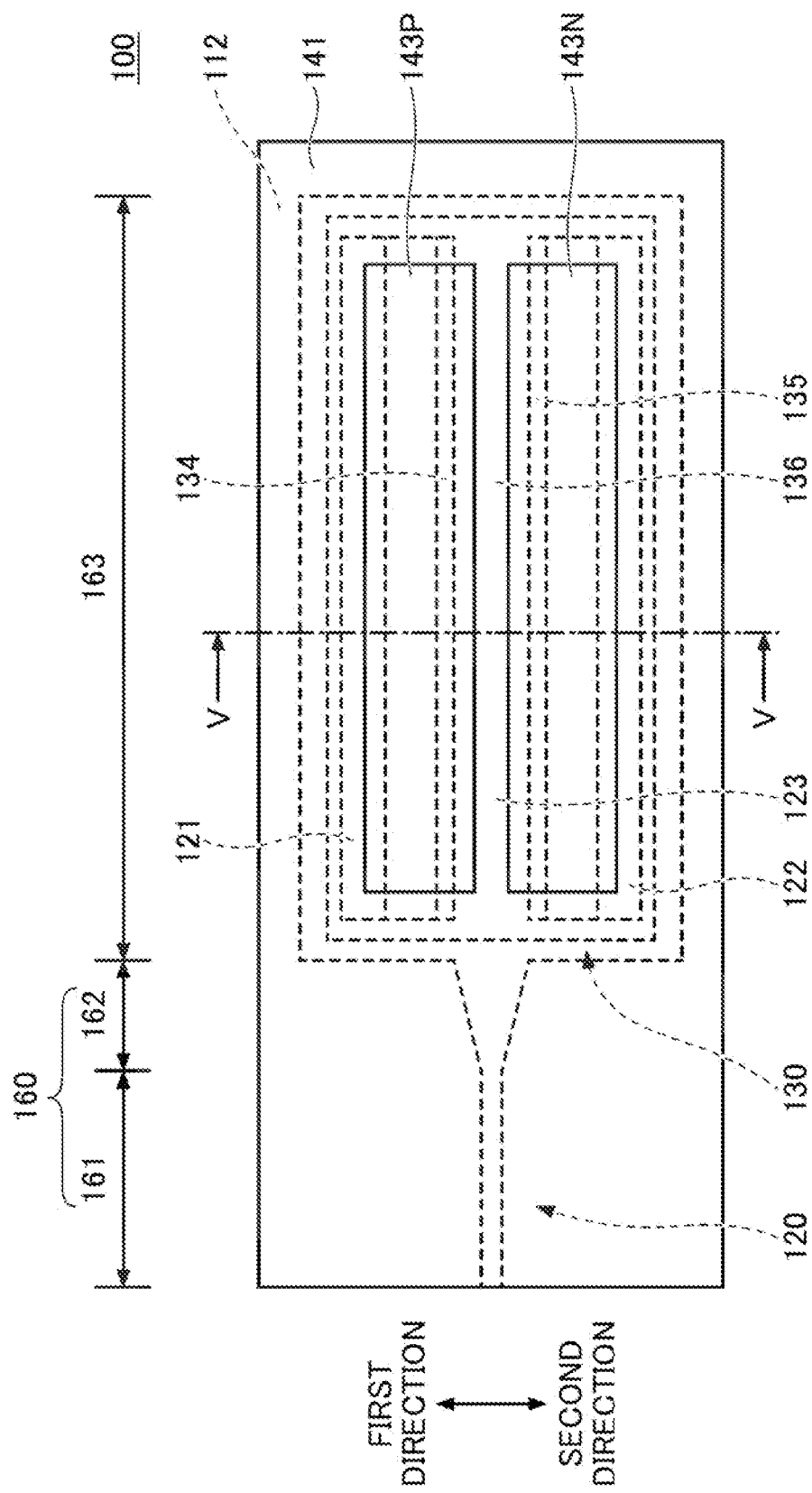
FIG. 3 is a top view illustrating a configuration of a semiconductor photodetector according to a first embodiment.
Figure 4:
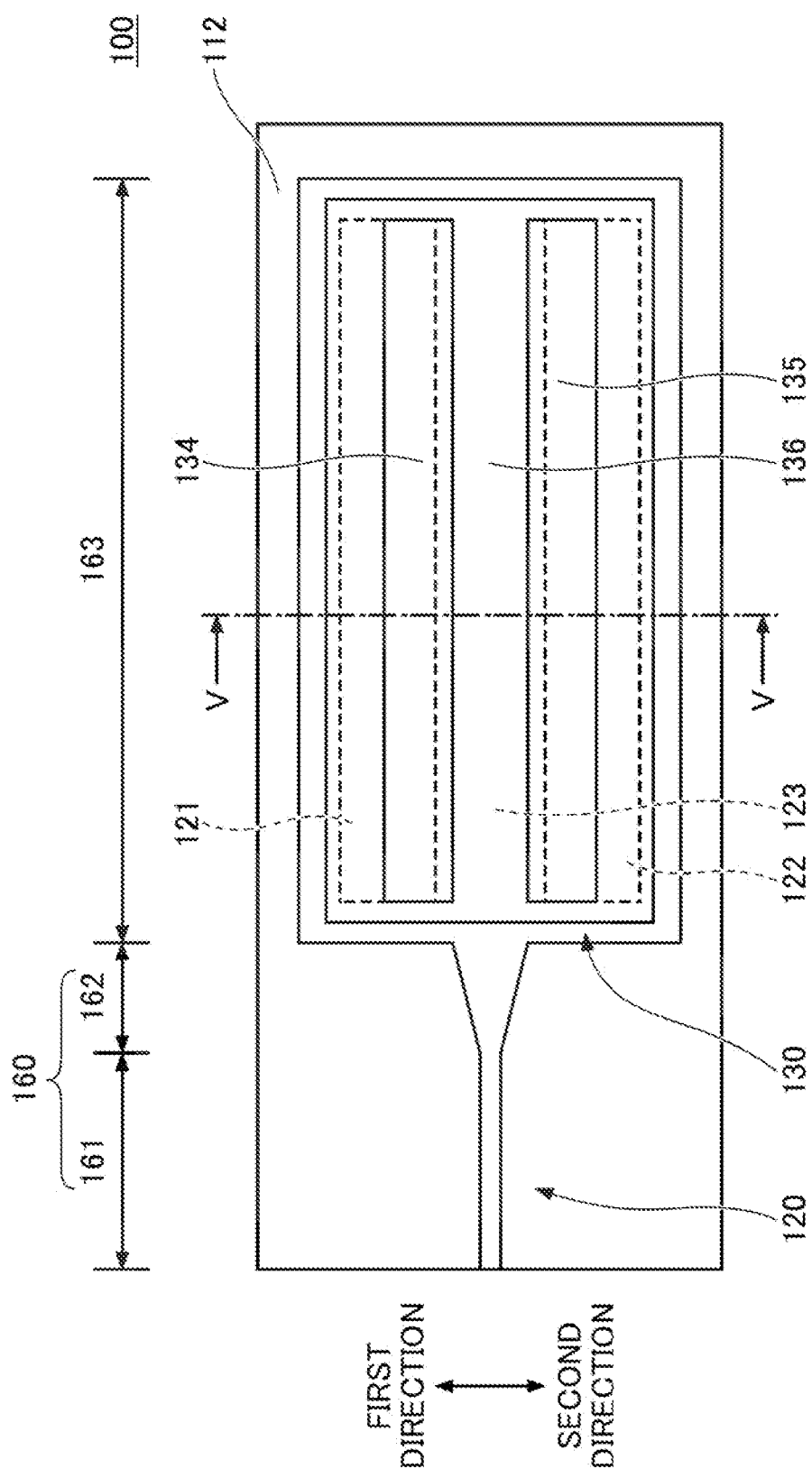
FIG. 4 is a diagram illustrating a layout of semiconductor regions in the semiconductor photodetector according to the first embodiment.
Figure 5:
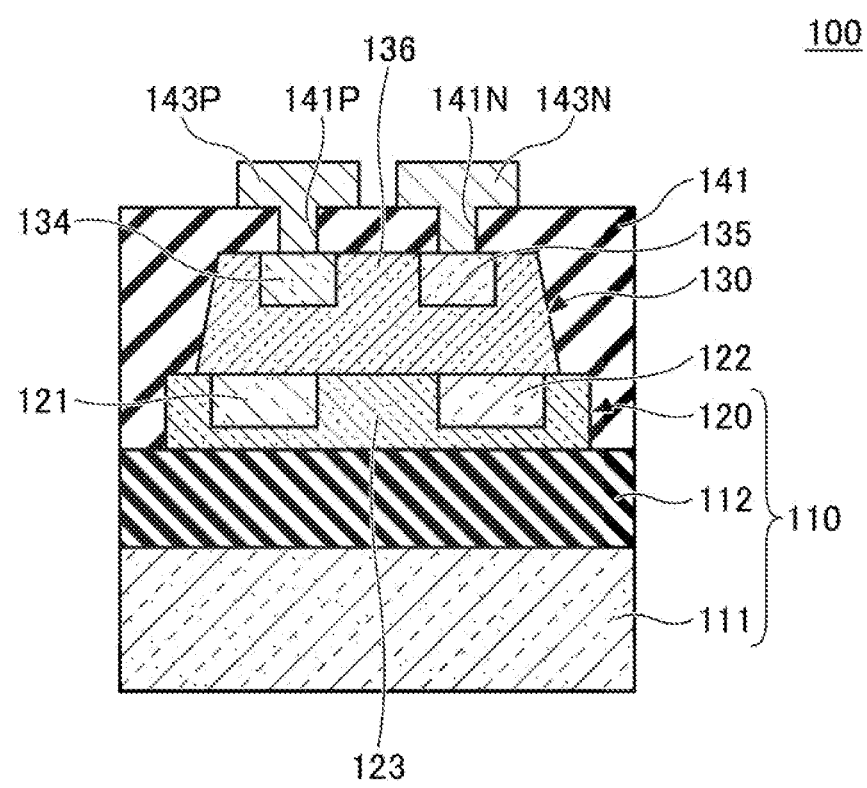
FIG. 5 is a cross-sectional view illustrating a configuration of the semiconductor photodetector according to the first embodiment.

First, a first embodiment will be described. The first embodiment relates to a semiconductor photodetector including a homojunction PD. FIG. 3 is a top view illustrating a configuration of a semiconductor photodetector according to the first embodiment. FIG. 4 is a diagram illustrating a layout of semiconductor regions in the semiconductor photodetector according to the first embodiment. FIG. 5 is a cross-sectional view illustrating a configuration of a semiconductor photodetector according to a first embodiment. FIG. 5 corresponds to a cross-sectional view along a V-V line in FIGS. 3 and 4.

As illustrated in FIGS. 3 to 5, the semiconductor photodetector 100 according to the first embodiment is fabricated on (silicon on insulator) substrate 110, and the semiconductor photodetector 100 includes a SOI substrate 110. The SOI substrate 110 includes a Si substrate 111, a Si oxide film 112, and a Si layer 120. The semiconductor photodetector 100 includes a light introduction portion 160 and a photoelectric converter portion 163. In the light introduction portion 160, the Si layer 120 is fabricated into a shape of an optical waveguide. The light introduction portion 160 includes a waveguide region 161 and a spot size converter portion 162 in which the Si layer 120 is processed into the shape of an optical spot size converter.

In the photoelectric converter portion 163, for example, the Si layer 120 is processed in a rectangular planar shape. The Si layer 120 has a p-type Si region 121, an n-type Si region 122, and a non-conductive i-type Si region 123. The p-type Si region 121 and the n-type Si region 122 are formed on a top surface of the i-type Si region 123. The p-type Si region 121 and the n-type Si region 122 are separated from each other in a direction perpendicular to a propagation direction of light guided from the light introduction portion 160 to the photoelectric converter portion 163. A portion of the i-type Si region 123 is interposed between the p-type Si region 121 and the n-type Si region 122. The p-type Si region 121 is located in the first direction in viewing from the i-type Si region 123, and the n-type Si region 122 is located in the second direction opposite to the first direction in viewing from the i-type Si region 123. The first direction and the second direction are perpendicular to the propagation direction of light guided from the light introduction portion 160 to the photoelectric converter portion 163. For example, the p-type Si region 121 contains boron (B) at a concentration of $0.5 \times 10^{19}$ cm$^{-3}$ to $1.5 \times 10^{19}$ cm$^{-3}$. For example, the n-type Si region 122 contains phosphorus (P) at a concentration of $0.5 \times 10^{19}$ cm$^{-3}$ to $1.5 \times 10^{19}$ cm$^{-3}$. The i-type Si region 123 might be unintentionally doped, but the i-type Si region 123 may contain minimal impurities, e.g., no more than $1.5 \times 10^{15}$ cm$^{-3}$ in concentration. The Si layer 120 is an example of the first semiconductor layer, the p-type Si region 121 is an example of the first region, the n-type Si region 122 is an example of the second region, and the i-type Si region 123 is an example of the third region.

In the photoelectric converter portion 163, for example, a Ge layer 130 is formed on the Si layer 120. In the first embodiment, the Ge layer 130 covers the p-type Si region 121 and the n-type Si region 122. The second refractive index of the Ge layer 130 is greater than the first refractive index of the Si layer 120, and the second band gap of the Ge layer 130 is smaller than the first band gap of the Si layer 120. The Ge layer 130 has a p-type Ge region 134, an n-type Ge region 135, and a non-conductive i-type Ge region 136. The p-type Ge region 134 and the n-type Ge region 135 are formed on a top surface of the i-type Ge region 136. The thickness of each of the p-type Ge region 134 and the n-type Ge region 135 is, for example, less than or equal to one-half the thickness of the Ge layer 130. The p-type Ge region 134 and the n-type Ge region 135 are separated from the Si layer 120 in the thickness direction. The p-type Ge region 134 and the n-type Ge region 135 are separated from each other in a direction perpendicular to a propagation direction of light guided from the light introduction portion 160 to the photoelectric converter portion 163. A portion of the i-type Ge region 136 is interposed between the p-type Ge region 134 and the n-type Ge region 135. The p-type Ge region 134 is located in the first direction in viewing from the i-type Ge region 136, and the n-type Ge region 135 is located in the second direction in viewing from the i-type Ge region 136.

In a plan view, a portion of the i-type Si region 123 between the p-type Si region 121 and the n-type Si region 122 overlaps a portion of the i-type Ge region 136 between the p-type Ge region 134 and the n-type Ge region 135. In a planar view, a first edge of the n-type Si region 122 or the n-type Ge region 135 indicates an edge located on the far side of the i-type Si region 123 or the i-type Ge region 136, and a second edge of the p-type Si region 121 or the p-type Ge region 134 indicates an edge located on the far side of the i-type Si region 123 or the i-type Ge region 136. In a planar view, the second edge of the p-type Si region 121 may be located more toward the first direction relative to the second edge of the p-type Ge region 134, and the first edge of the n-type Si region 122 may be located more toward the second direction relative to the first edge of the n-type Ge region 135. For example, the p-type Ge region 134 contains boron at a concentration of $0.5 \times 10^{20}$ cm$^{-3}$ to $1.5 \times 10^{20}$ cm$^{-3}$. For example, the n-type Ge region 135 contains phosphorus at a concentration of $0.5 \times 10^{20}$ cm$^{-3}$ to $1.5 \times 10^{20}$ cm$^{-3}$. The i-type Ge region 136 might be unintentionally doped, but the i-type Ge region 136 may contain minimal impurities, e.g., no more than $1.5 \times 10^{15}$ cm$^{-3}$ in concentration. The Ge layer 130 is an example of the second semiconductor layer, the p-type Ge region 134 is an example of the fourth region, the n-type Ge region 135 is an example of the fifth region, and the i-type Ge region 136 is an example of the sixth region.

A Si oxide film 141 is formed so as to cover a stack of the Si layers 120 and the Ge layer 130. An opening 141P reaching the p-type Ge region 134 and an opening 141N reaching the n-type Ge region 135 are formed in the Si oxide film 141. A metal film 143P in ohmic contact with the p-type Ge region 134 through the opening 141P and a metal film 143N in ohmic contact with the n-type Ge region 135 through the opening 141N are formed on the Si oxide film 141. The metal film 143P and the metal film 143N contain, for example, aluminum (Al). The metal film 143P is an example of a first electrode, and the metal film 143N is an example of a second electrode.

Figure 6:
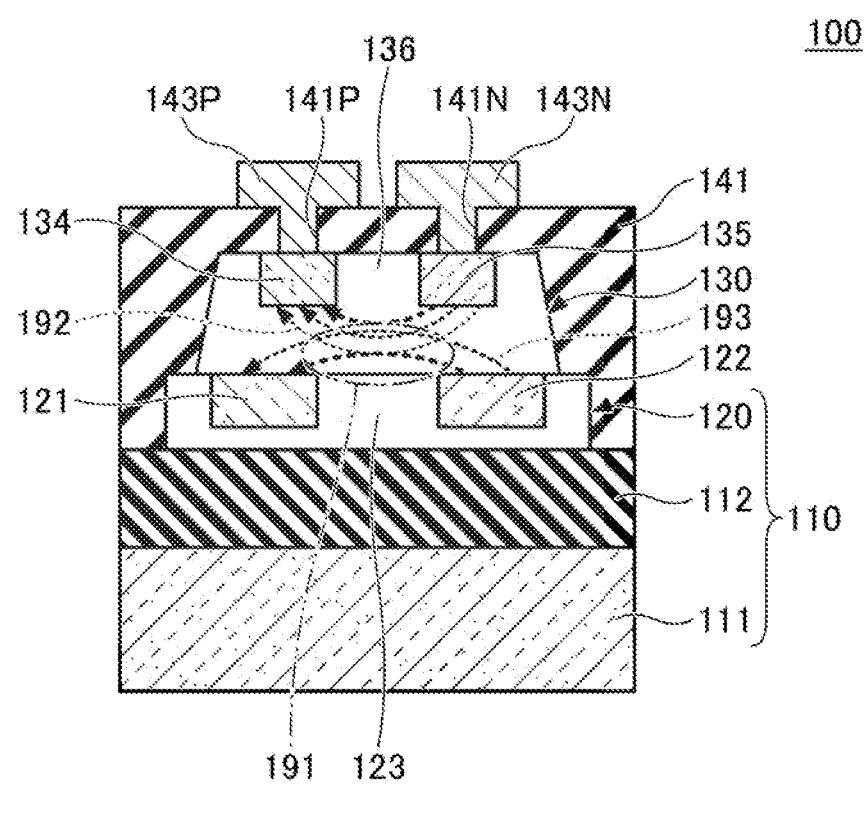
FIG. 6 is a diagram illustrating a distribution of guided light and the electric field in the semiconductor photodetector according to the first embodiment.

Herein, the action and effect of the semiconductor photodetector 100 will be described. FIG. 6 is a diagram illustrating a distribution of the guided light and the electric field in the semiconductor photodetector 100 according to the first embodiment. Note that in FIG. 6, the thicker the electric flux line illustrated by the dashed line, the stronger the electric field.

The semiconductor photodetector 100 uses a Si layer 120 as an optical waveguide, and light propagating through the Si layer 120 enters the Ge layer 130 by evanescent optical coupling. Then, guided light 191 incident on the Ge layer 130 is absorbed by the Ge layer 130, and a photocarrier is generated in the Ge layer 130. In addition, an electric field 192 is generated between the n-type Ge region 135 and the p-type Ge region 134. Since the Si layer 120 has the p-type Si region 121, the i-type Si region 123, and the n-type Si region 122, an electric field 193 is also generated between the p-type Si region 121 and the n-type Si region 122 due to the built-in potential of the PIN structure, where the electric field 193 contributes to the movement of the photocarriers. Accordingly, in the semiconductor photodetector 100, the electric field 193 of the PIN structure within the Si layer 120 is superimposed on the electric field 192 due to the PIN structure within the Ge layer 130, where the Ge layer 130 functions as a light absorbing layer. Thus, according to the semiconductor photodetector 100, it is possible to provide a greater electric field intensity in a region where the intensity of the guided light 191 is high while reducing the ineffective absorption in metal. As a result, an excellent optical responsivity and operating speed can be obtained.

In addition, in the present embodiment, the spot size converter portion 162 expands the guided light mode that has been strongly confined within the optical waveguide of the waveguide region 161, thereby improving the coupling to the Ge layer 130. Thus, it is possible to improve the optical responsivity.

Figure 7:
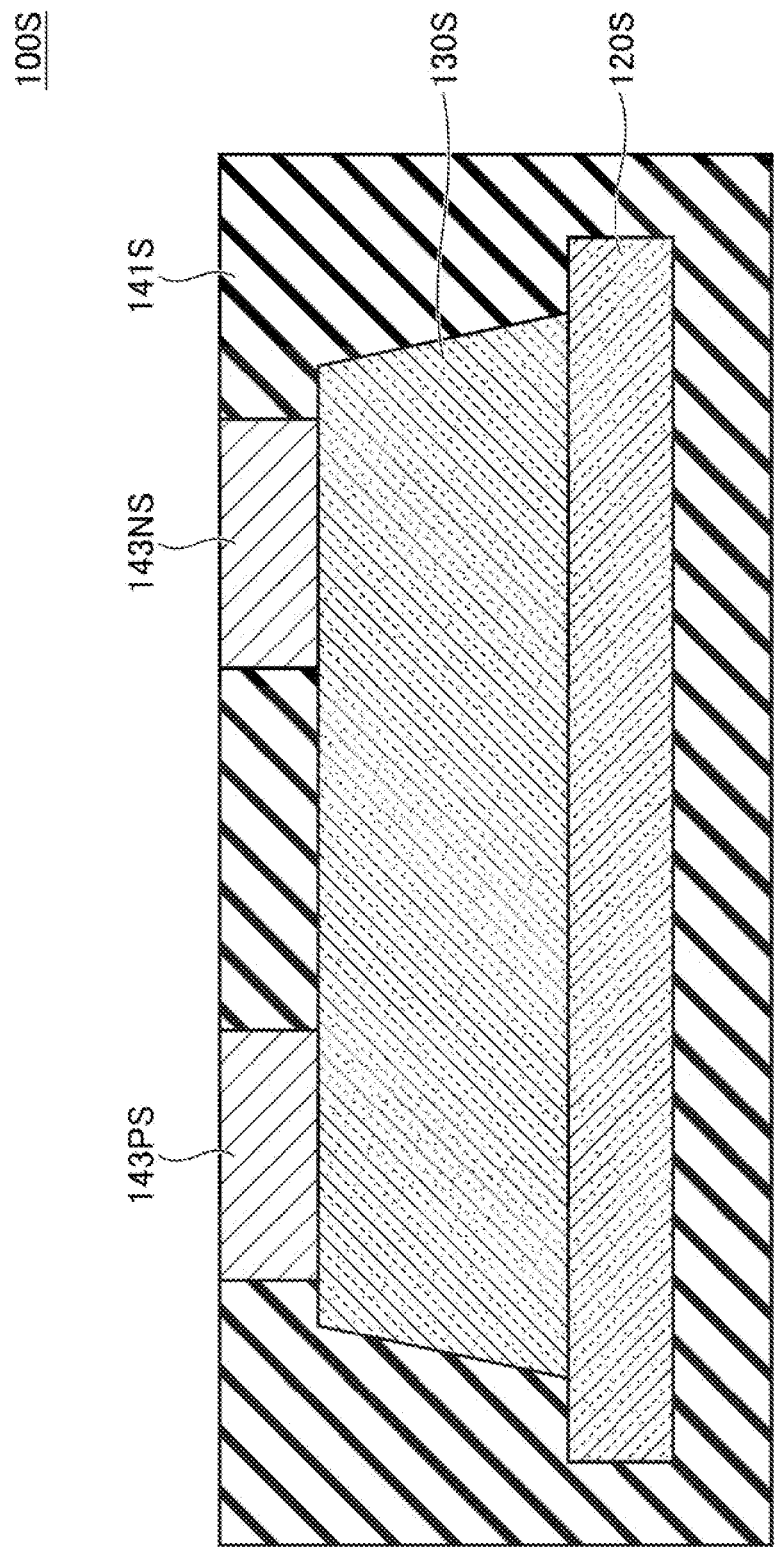
FIG. 7 is a cross-sectional view illustrating a configuration of a semiconductor photodetector subject to simulation.
Figure 8:
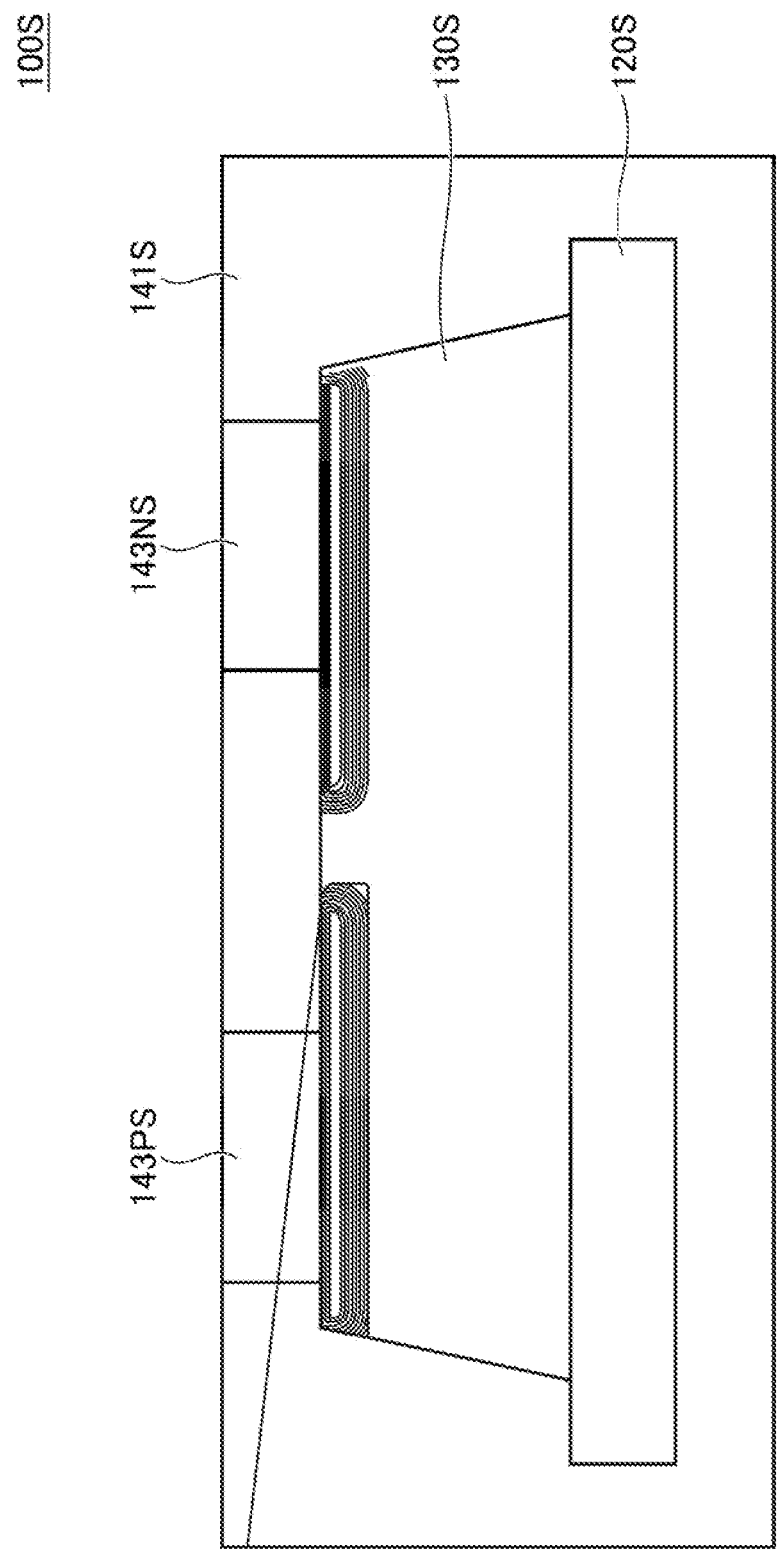
FIG. 8 is a diagram illustrating a distribution of impurity concentration in a simulation with respect to the first example.
Figure 9:
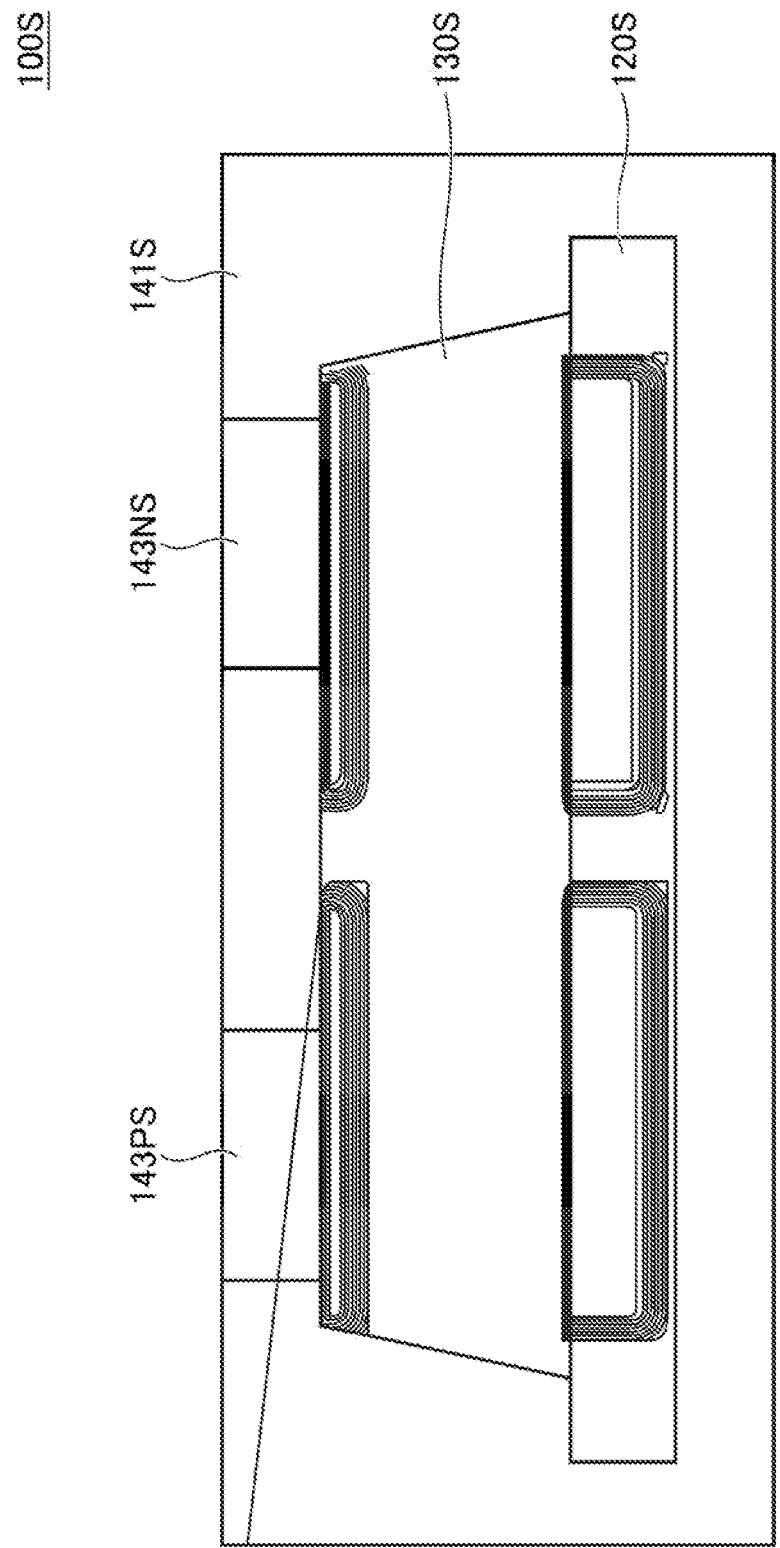
FIG. 9 is a diagram illustrating a contour map depicting a distribution of impurity concentration in a simulation with respect to the first embodiment.

Hereinafter, a simulation relating to each of the first example and the first embodiment will be described. FIG. 7 is a cross-sectional view illustrating a configuration of a semiconductor photodetector subject to simulation. FIG. 8 is a diagram illustrating a distribution of impurity concentration in a simulation with respect to the first example. FIG. 9 is a diagram illustrating a contour map depicting a distribution of the impurity concentration in the simulation with respect to the first embodiment.

The semiconductor photodetector 100S subject to simulation includes a Si layer 120S and a Ge layer 130S on the Si layer 120S. The Si layer 120S is 200 nm thick and the Ge layer 130S is 500 nm thick. An Al film 143PS and an Al film 143NS are formed on the Ge layer 130S. The Si layer 120S, the Ge layer 130S, the Al film 143PS, and the Al film 143NS are covered with a Si oxide film 141S.

In the simulation of the first example, as illustrated in FIG. 8, it is assumed that a p-type impurity be contained in a portion corresponding to the p-type Ge region 134 at a concentration of $1\times10^{21}$ cm$^{-3}$, and an n-type impurity be contained in a portion corresponding to the n-type Ge region 135 at a concentration of $1\times10^{21}$ cm$^{-3}$. In the simulation of the first embodiment, as illustrated in FIG. 9, it is assumed that in addition to the impurities illustrated in FIG. 8, the p-type impurity be contained in a portion corresponding to the p-type Si region 121 at a concentration of $1\times10^{20}$ cm$^{-3}$, and the n-type impurity be contained in a portion corresponding to the n-type Si region 122 at a concentration of $1\times10^{20}$ cm$^{-3}$.

Figure 10:
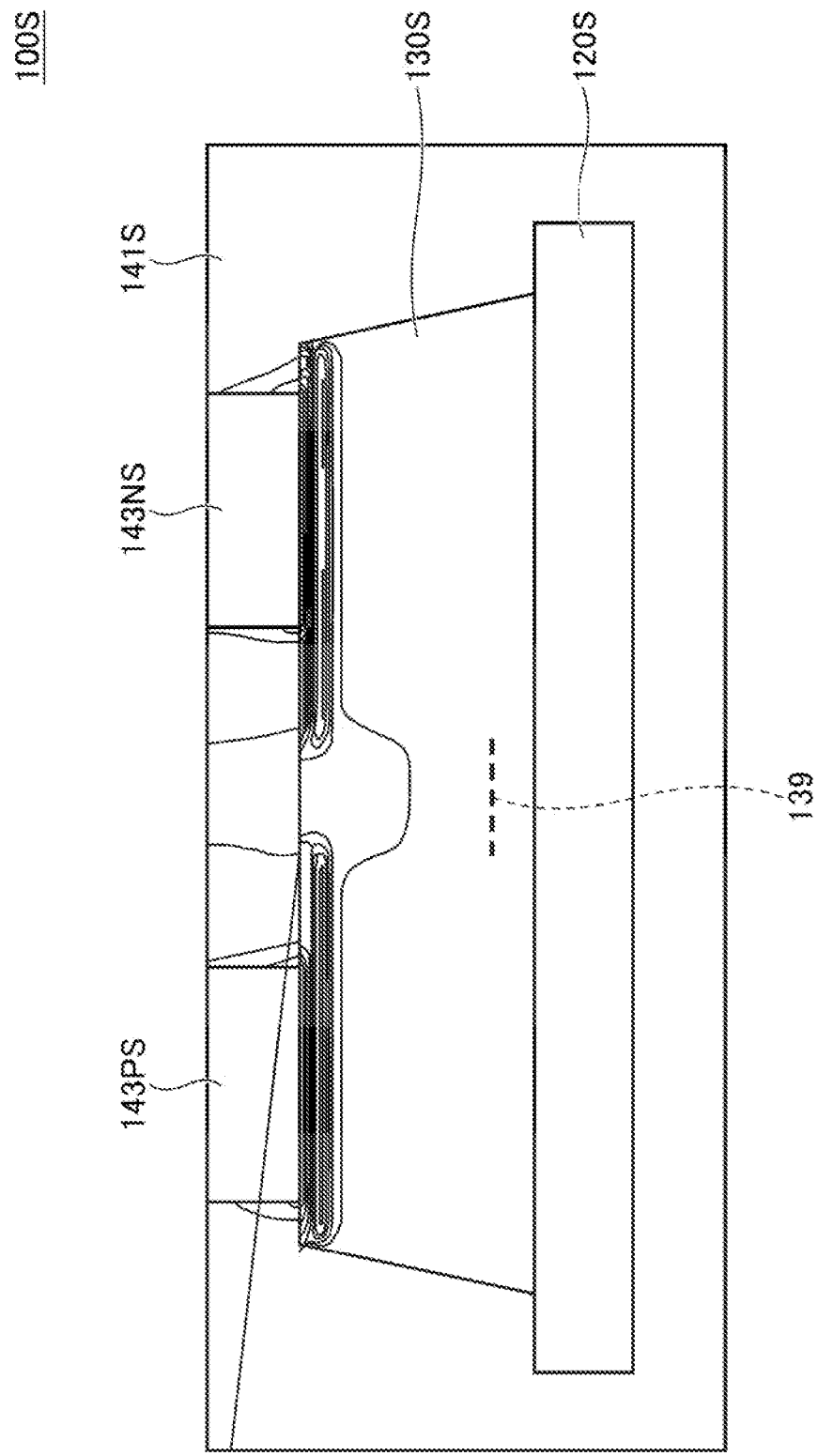
FIG. 10 is a diagram illustrating a contour map depicting a distribution of electric field intensity in a simulation with respect to the first example.
Figure 11:
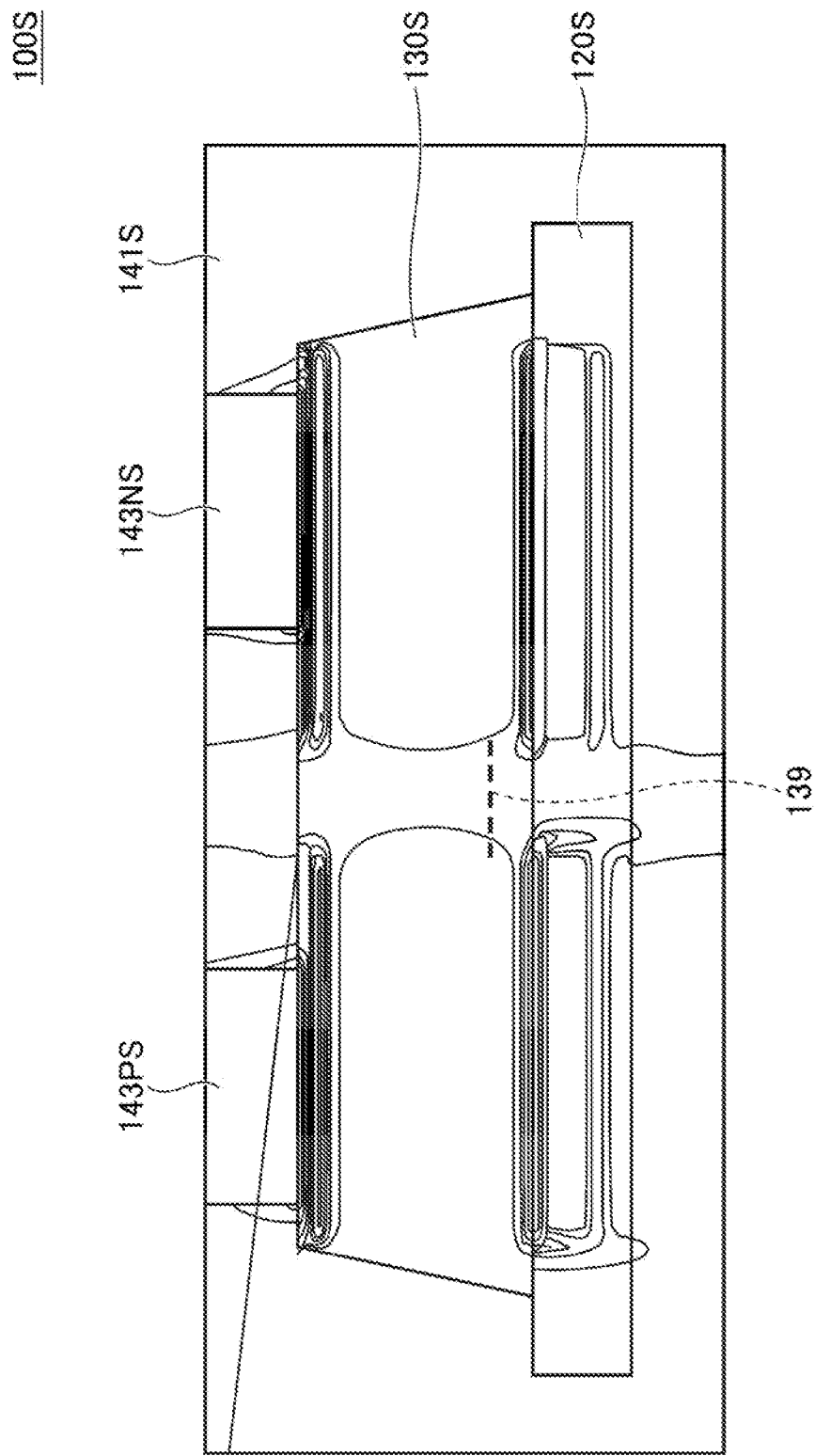
FIG. 11 is a diagram illustrating a contour map depicting a distribution of electric field intensity in a simulation with respect to the first embodiment.

Then, the electric field intensity distribution is calculated when a 1 V potential difference is applied from the outside between the Al film 143PS and the Al film 143NS. FIG. 10 is a diagram illustrating a contour map depicting a distribution of electric field intensity in the simulation with respect to the first example. FIG. 11 is a diagram illustrating a contour map depicting a distribution of electric field intensity in the simulation with respect to the first embodiment.

As illustrated in FIGS. 10 and 11, in the simulation of the first example, the electric field intensity is high in an upper layer portion of the Ge layer 130S, but the electric field intensity is extremely low in a lower layer portion of the Ge layer 130S. By contrast, in the simulation of the first embodiment, not only the electric field intensity is high in an upper layer portion of the Ge layer 130S, but the region having the high electric field intensity is spread over a lower layer portion.

Figure 12:
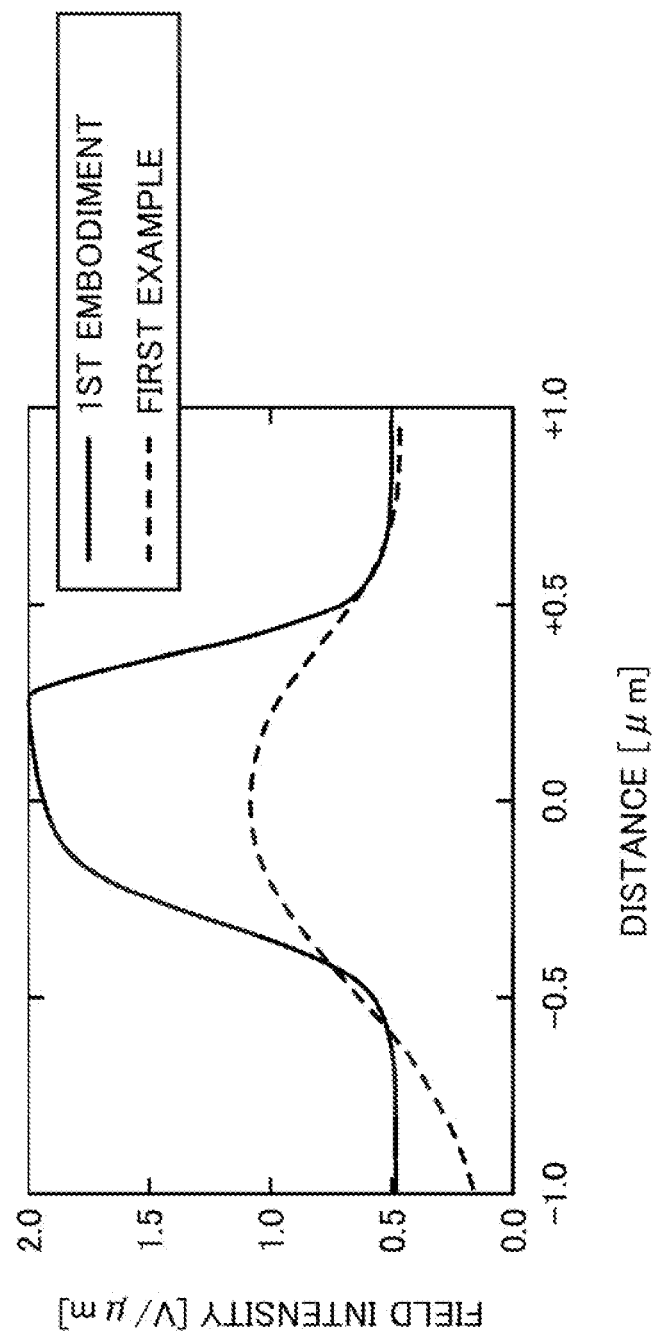
FIG. 12 is a diagram illustrating electric field intensity in a region of 100 nm from a bottom surface of a Ge layer.

FIG. 12 is a diagram illustrating the electric field intensity in a region 100 nm above the bottom surface of the Ge layer 130S. The region 100 nm above the bottom surface of the Ge layer 130S corresponds to a region where the intensity of the guided light is high. FIG. 12 illustrates the electric field intensity in the region illustrated by a dashed line 139 in FIGS. 10 and 11. The horizontal axis in FIG. 12 represents a position of the Ge layer 130 in a horizontal axis direction relative to the center of the horizontal axis direction illustrated in FIGS. 10 and 11. As illustrated in FIG. 12, in the region 100 nm above the bottom surface of the Ge layer 130S, the maximum field intensity in the simulation with respect to the first embodiment was approximately twice the maximum field intensity in the simulation with respect to the first example.

As a result of this simulation, according to the first embodiment, the transport speed of the photocarrier is improved and the response characteristics are improved compared to the first example. In addition, as illustrated in FIG. 9, since an impurity is substantially absent near the bottom surface of the Ge layer 130S, a decrease in the optical responsivity due to the free carrier absorption is prevented.

Next, a method for fabricating the semiconductor photodetector 100 according to the first embodiment will be described. FIGS. 13 to 27 are top views illustrating a method for fabricating the semiconductor photodetector 100 according to the first embodiment. FIGS. 28 to 42 are cross-sectional views illustrating a method for fabricating the semiconductor photodetector 100 according to the first embodiment.

Figure 13:
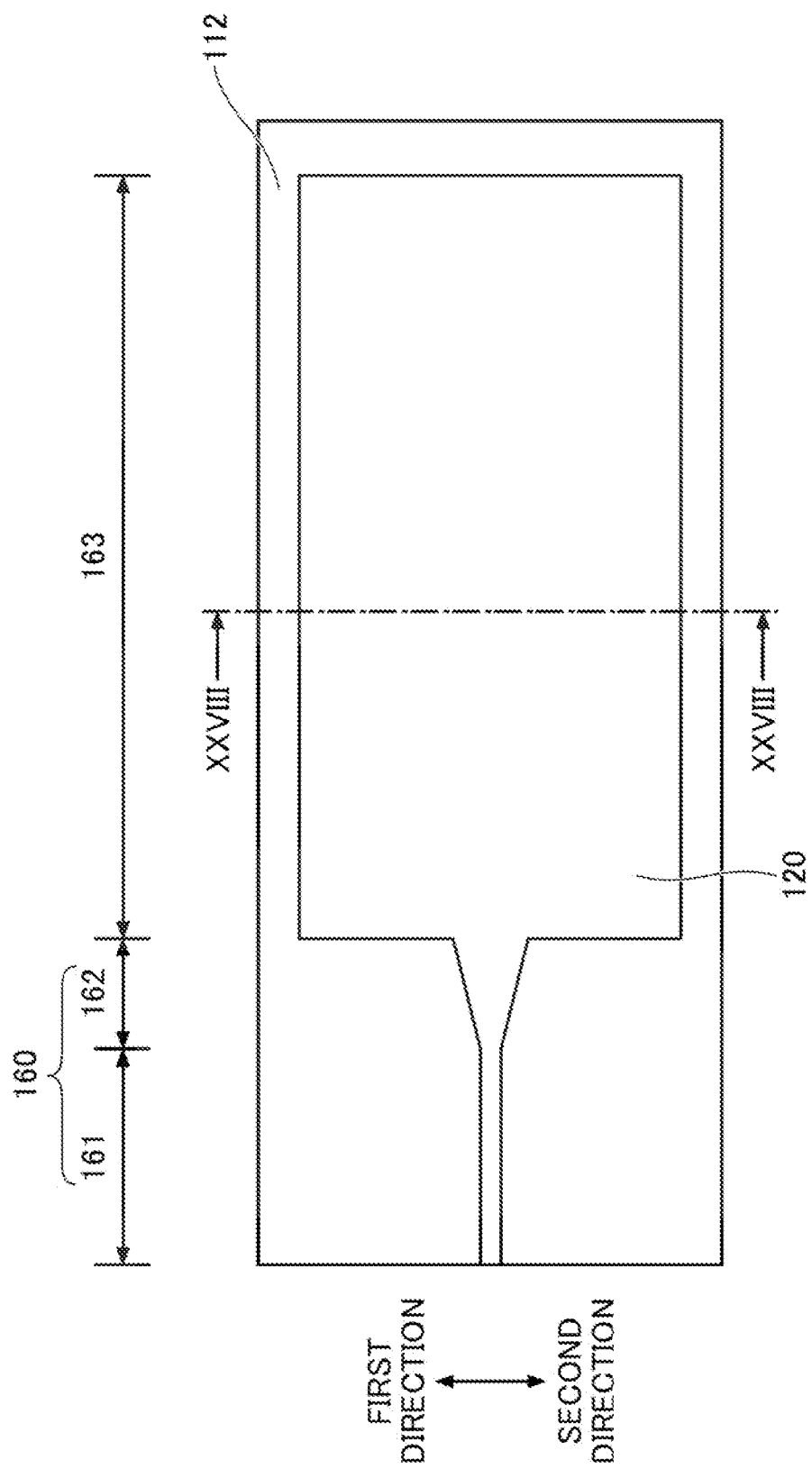
FIG. 13 is a top view (1) illustrating a method for fabricating a semiconductor photodetector according to the first embodiment.
Figure 28:
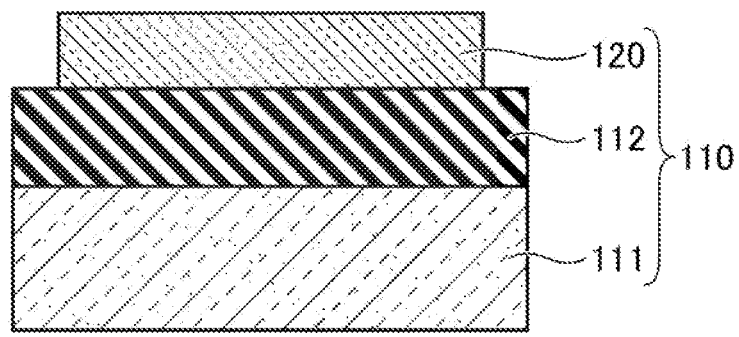
FIG. 28 is a cross-sectional view (1) illustrating a method for fabricating a semiconductor photodetector according to the first embodiment.

First, as illustrated in FIGS. 13 and 28, a SOI substrate 110 is prepared to process a Si layer 120. For example, a Si substrate 111 may be 700 µm to 800 µm thick, a Si oxide film 112 may be 1.5 µm to 2.5 µm thick, and the Si layer 120 may be 200 nm to 300 nm thick. The Si layer 120 can be fabricated by electron beam (EB) lithography and inductively coupled plasma (ICP) dry etching. For example, in the waveguide region 161, the Si layer 120 is processed into a linear shape extending in one direction. In the spot size converter portion 162, the Si layer 120 is processed into a planar shape extending in a tapered shape from the waveguide region 161 toward the photoelectric converter portion 163. In the photoelectric converter portion 163, the Si layer 120 is processed into a rectangular planar shape. For example, of the light introduction portion 160, the width of the Si layer 120 is 400 nm to 600 nm in the waveguide region 161, is 400 nm to 600 nm in the boundary between the waveguide region 161 and the spot size converter portion 162, and is 800 nm to 1100 nm in the boundary between the spot size converter portion 162 and the photoelectric converter portion 163. The dimensions of the Si layer 120 in the photoelectric converter portion 163 are 30 µm to 40 µm in a light propagation direction, and 5 µm to 15 µm in the direction perpendicular to the light propagation direction (the direction parallel to the first direction and the second direction). FIG. 28 corresponds to a cross-sectional view along the XXVIII-XXVIII line in FIG. 13.

Figure 14:
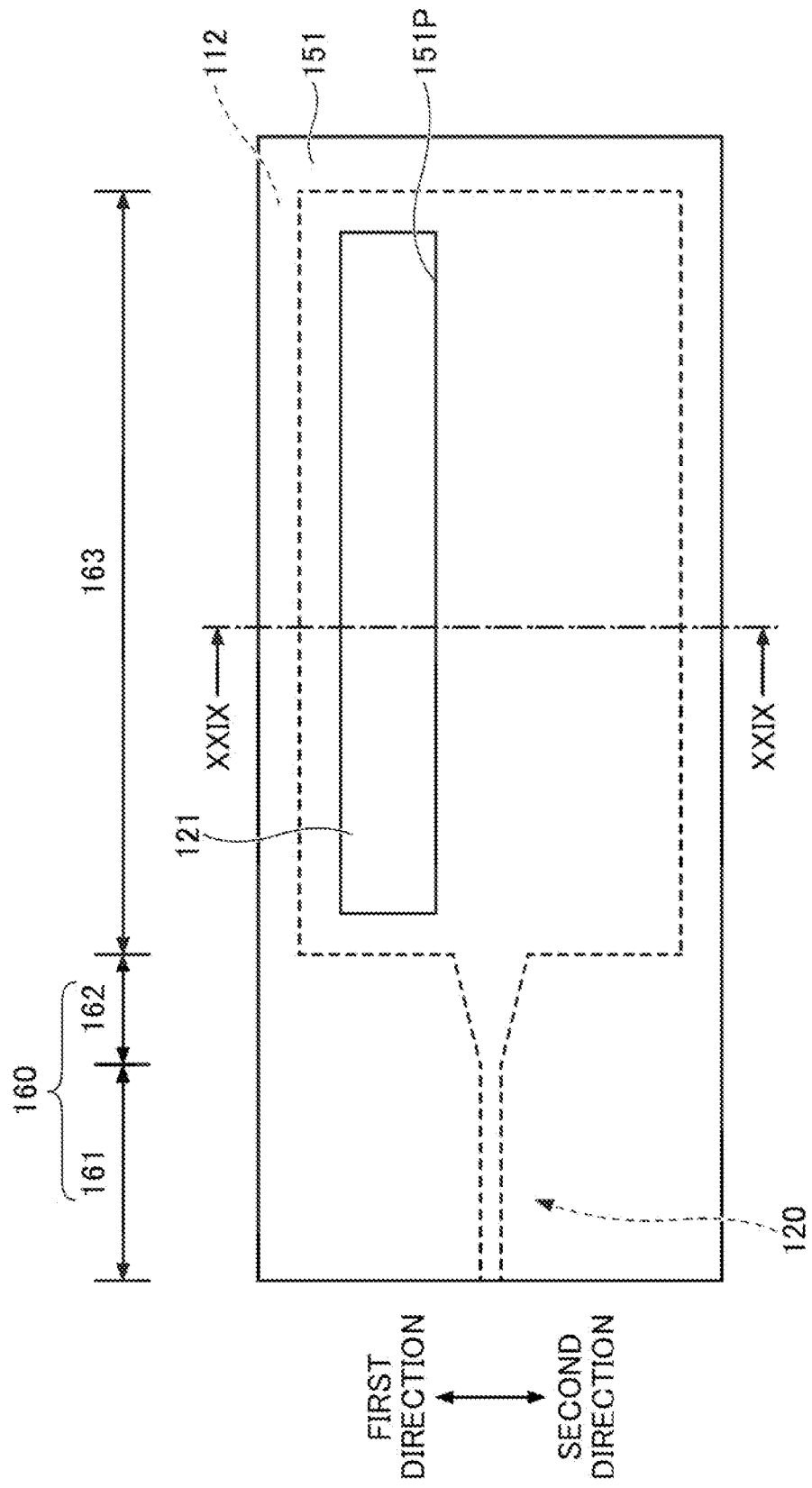
FIG. 14 is a top view (2) illustrating a method for fabricating the semiconductor photodetector according to the first embodiment.
Figure 29:
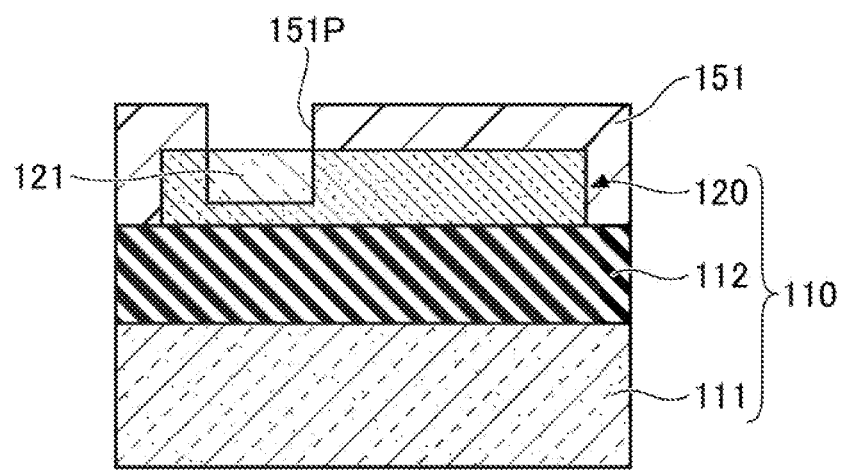
FIG. 29 is a cross-sectional view (2) illustrating the method for fabricating a semiconductor photodetector according to a first embodiment.

Then, as illustrated in FIGS. 14 and 29, a photoresist mask 151 is formed on the SOI substrate 110 having an opening 151P that opens a region intended to form the p-type Si region 121. The photoresist mask 151 can be formed by coating, exposing, and developing a photoresist agent. Thereafter, the p-type Si region 121 is formed in the Si layer 120 by ion implantation of a p-type impurity such as boron. FIG. 29 corresponds to a cross-sectional view along XXIX-XXIX line in FIG. 14.

Figure 15:
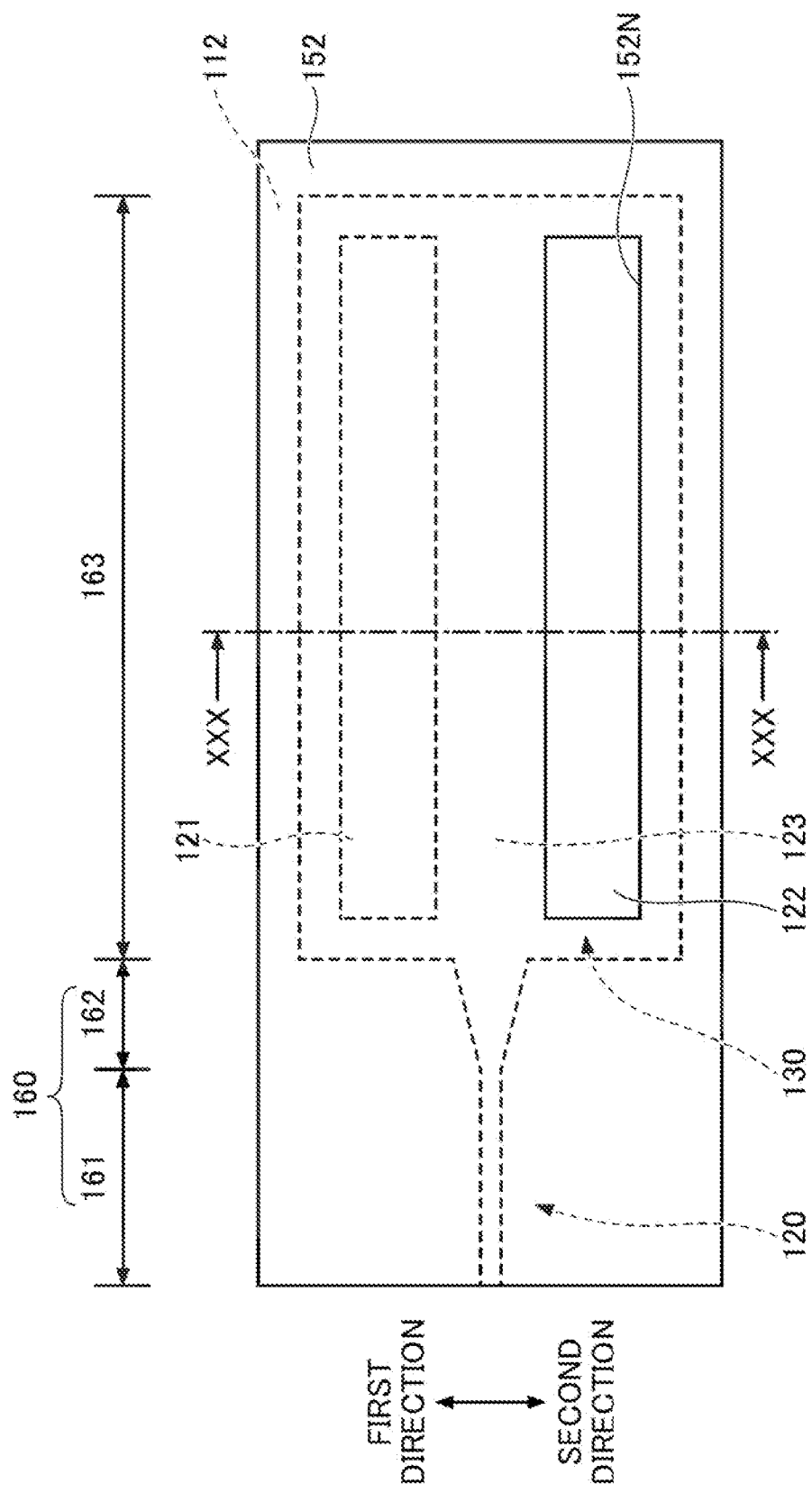
FIG. 15 is a top view (3) illustrating the method for fabricating a semiconductor photodetector according to the first embodiment.
Figure 30:
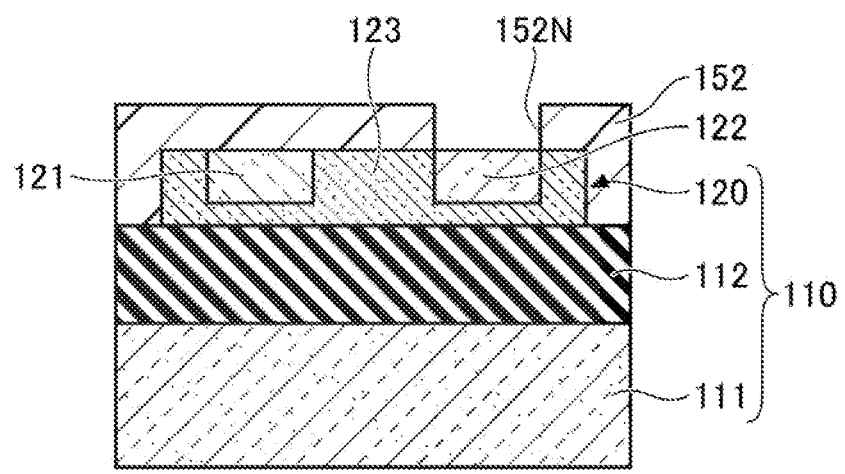
FIG. 30 is a cross-sectional view (3) illustrating the method for fabricating a semiconductor photodetector according to the first embodiment.

Subsequently, as illustrated in FIGS. 15 and 30, the photoresist mask 151 is removed, and a photoresist mask 152 having an opening 152N that opens a region intended to form the n-type Si region 122 is formed on the SOI substrate 110. The photoresist mask 152 can be formed by coating, exposing, and developing a photoresist agent. The n-type Si region 122 is then formed in the Si layer 120 by ion implantation of an n-type impurity such as phosphorus. The remaining portion of the Si layer 120 in the photoelectric converter portion 163 is the i-type Si region 123. FIG. 30 corresponds to a cross-sectional view along XXX-XX line in FIG. 15.

Figure 16:
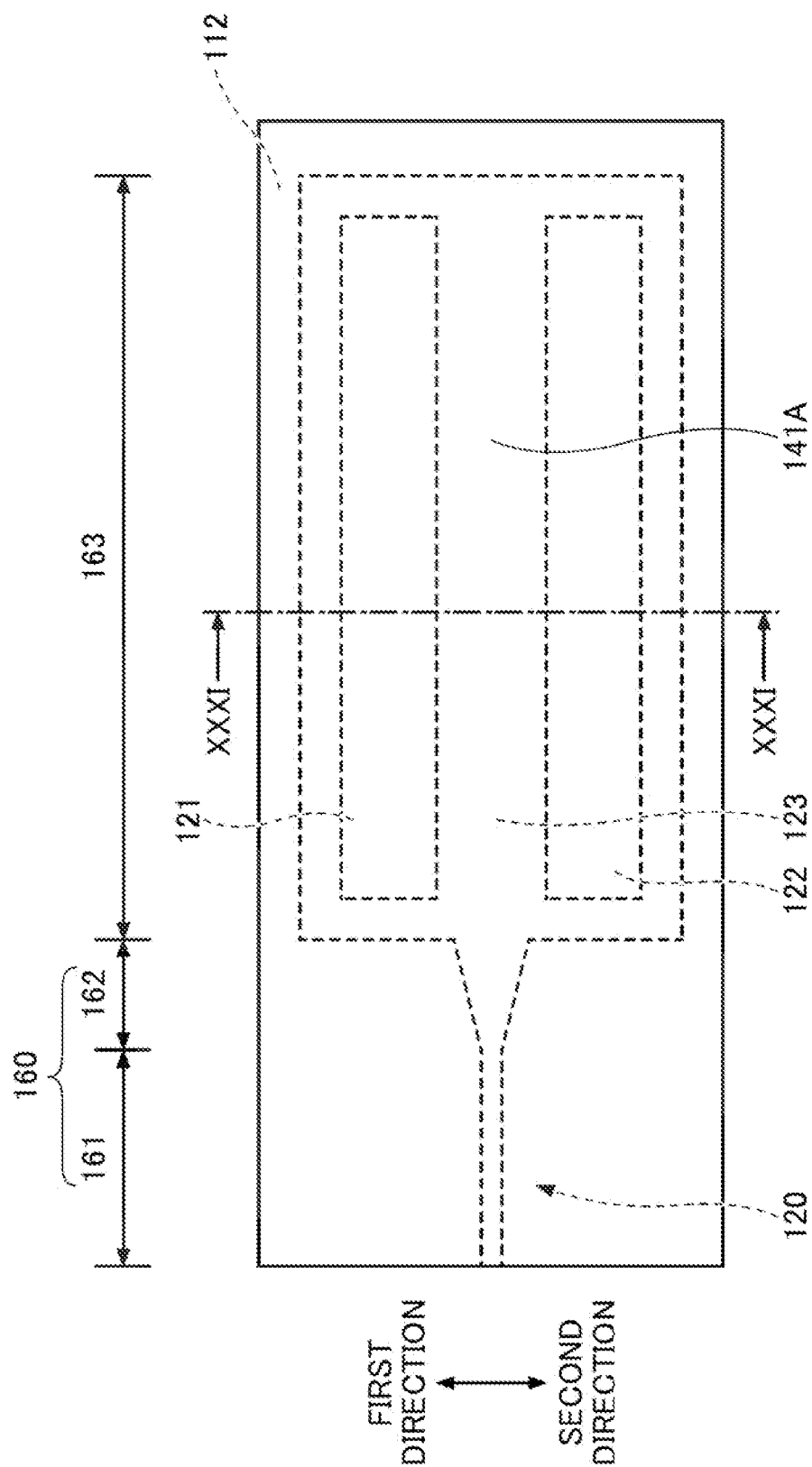
FIG. 16 is a top view (4) illustrating the method for fabricating a semiconductor photodetector according to the first embodiment.
Figure 31:
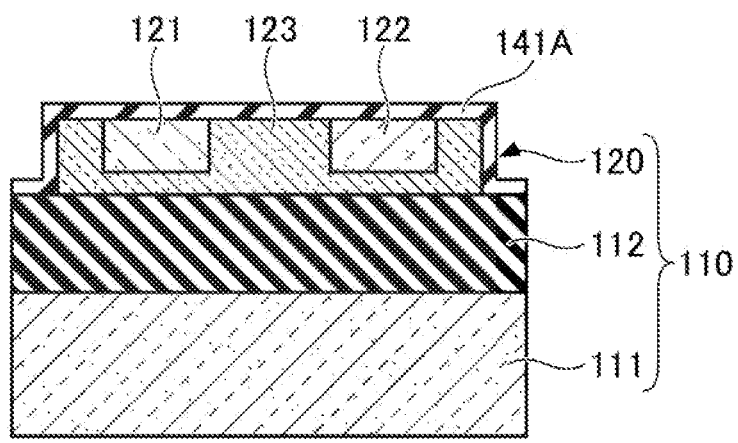
FIG. 31 is a cross-sectional view (4) illustrating the method for fabricating a semiconductor photodetector according to a first embodiment.

Thereafter, the photoresist mask 152 is removed, as illustrated in FIGS. 16 and 31. Subsequently, a silicon oxide film 141A is formed on the SOI substrate 110. The Si oxide film 141A may be formed, for example, by the chemical vapor deposition (CVD) process, with a thickness of Si oxide film 141A of 15 nm to 25 nm. Subsequently, the p-type and n-type impurities implanted into the Si layer 120 are activated by annealing. The annealing is carried out at a temperature of, for example, 900° C. to 1100° C., for a period of 0.5 minutes to 2 minutes. FIG. 31 corresponds to a cross-sectional view along a XXXI-XXXI line in FIG. 16.

Figure 17:
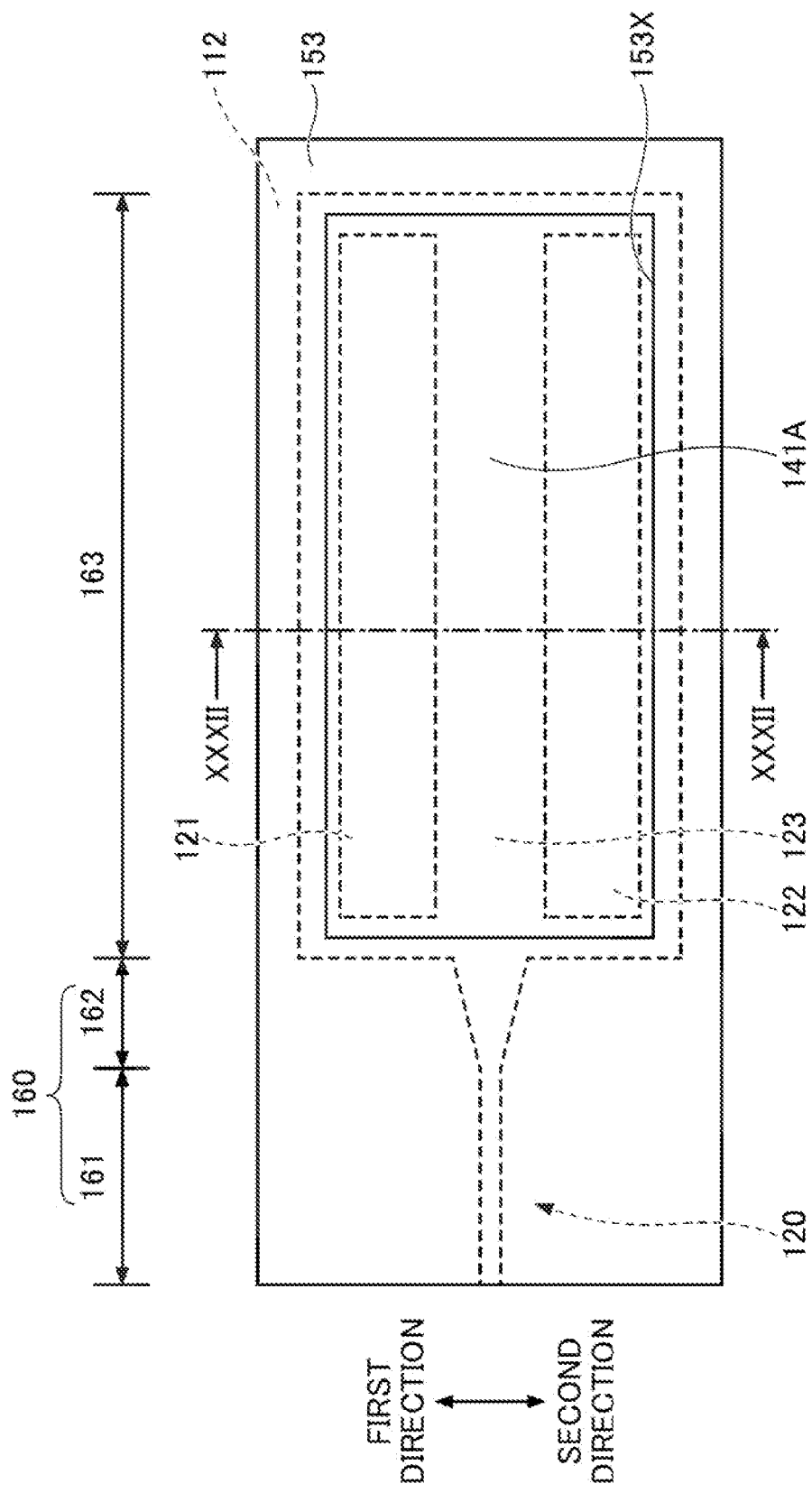
FIG. 17 is a top view (5) illustrating the method for fabricating a semiconductor photodetector according to the first embodiment.
Figure 32:
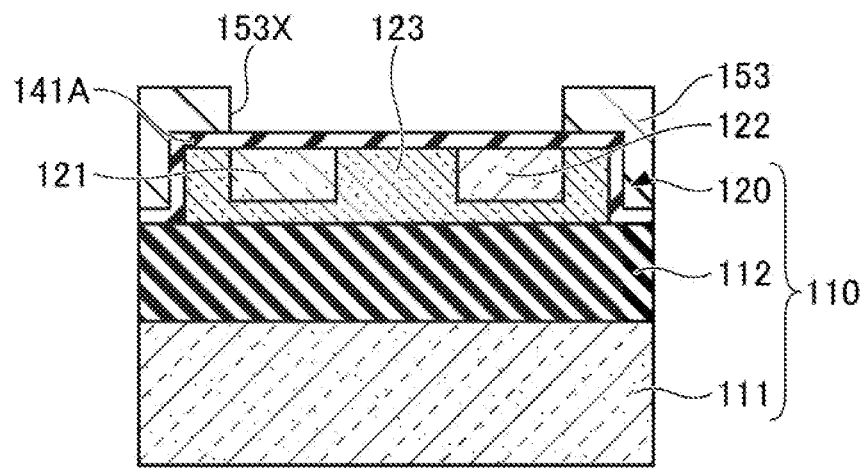
FIG. 32 is a cross-sectional view (5) illustrating the method for fabricating a semiconductor photodetector according to the first embodiment.

Subsequently, as illustrated in FIGS. 17 and 32, a photoresist mask 153 having an opening 153X that opens a region intended to form the Ge layer 130 is formed on the Si oxide film 141A. The photoresist mask 153 can be formed by coating, exposing, and developing a photoresist agent. For example, the total length of the opening 153X is 25 µm to 35 µm, and the total width of the opening 153X is 5 µm to 10 µm. FIG. 32 corresponds to a cross-sectional view along the XXXII-XXXII line in FIG. 17.

Figure 18:
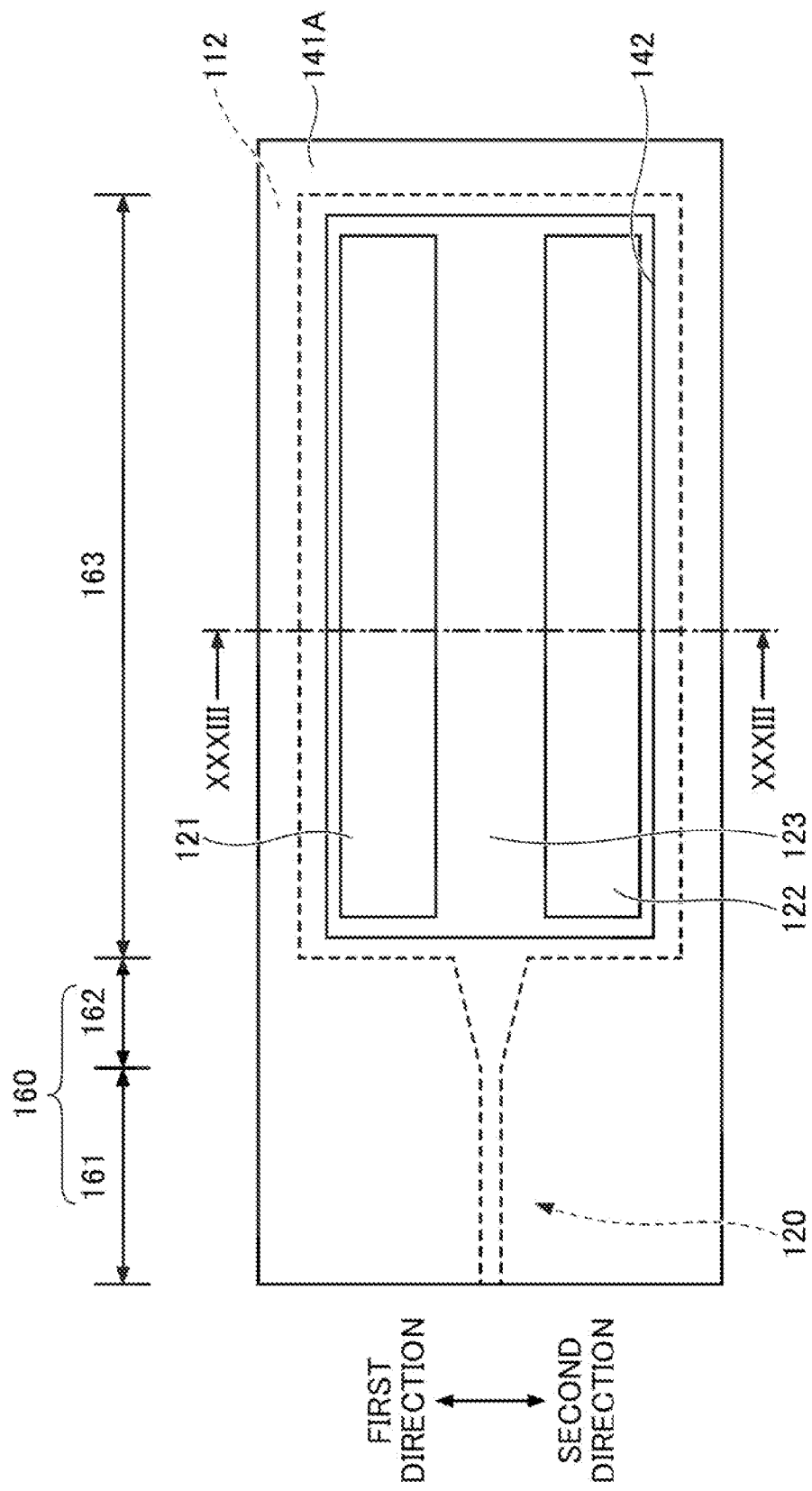
FIG. 18 is a top view (6) illustrating the method for fabricating a semiconductor photodetector according to the first embodiment.
Figure 33:
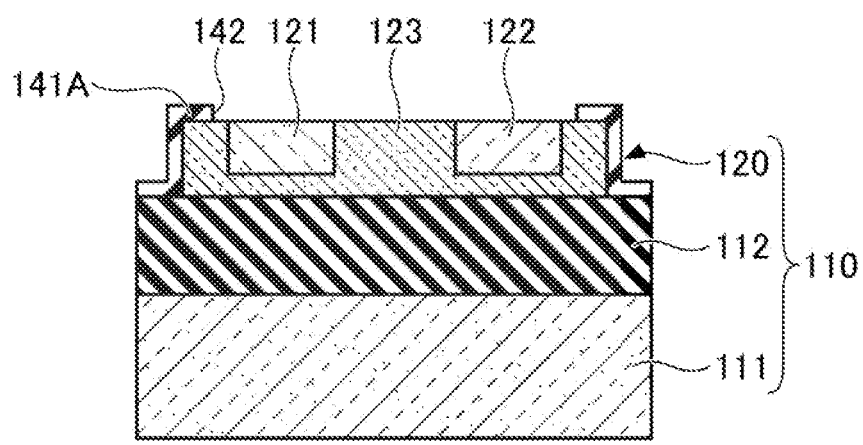
FIG. 33 is a cross-sectional view (6) illustrating the method for fabricating a semiconductor photodetector according to the first embodiment.

Then, as illustrated in FIGS. 18 and 33, an opening 142 is formed in the Si oxide film 141A by dry etching of the Si oxide film 141A. The photoresist mask 153 is then removed. FIG. 33 corresponds to a cross-sectional view along the XXXIII-XXXIII line in FIG. 18.

Figure 19:
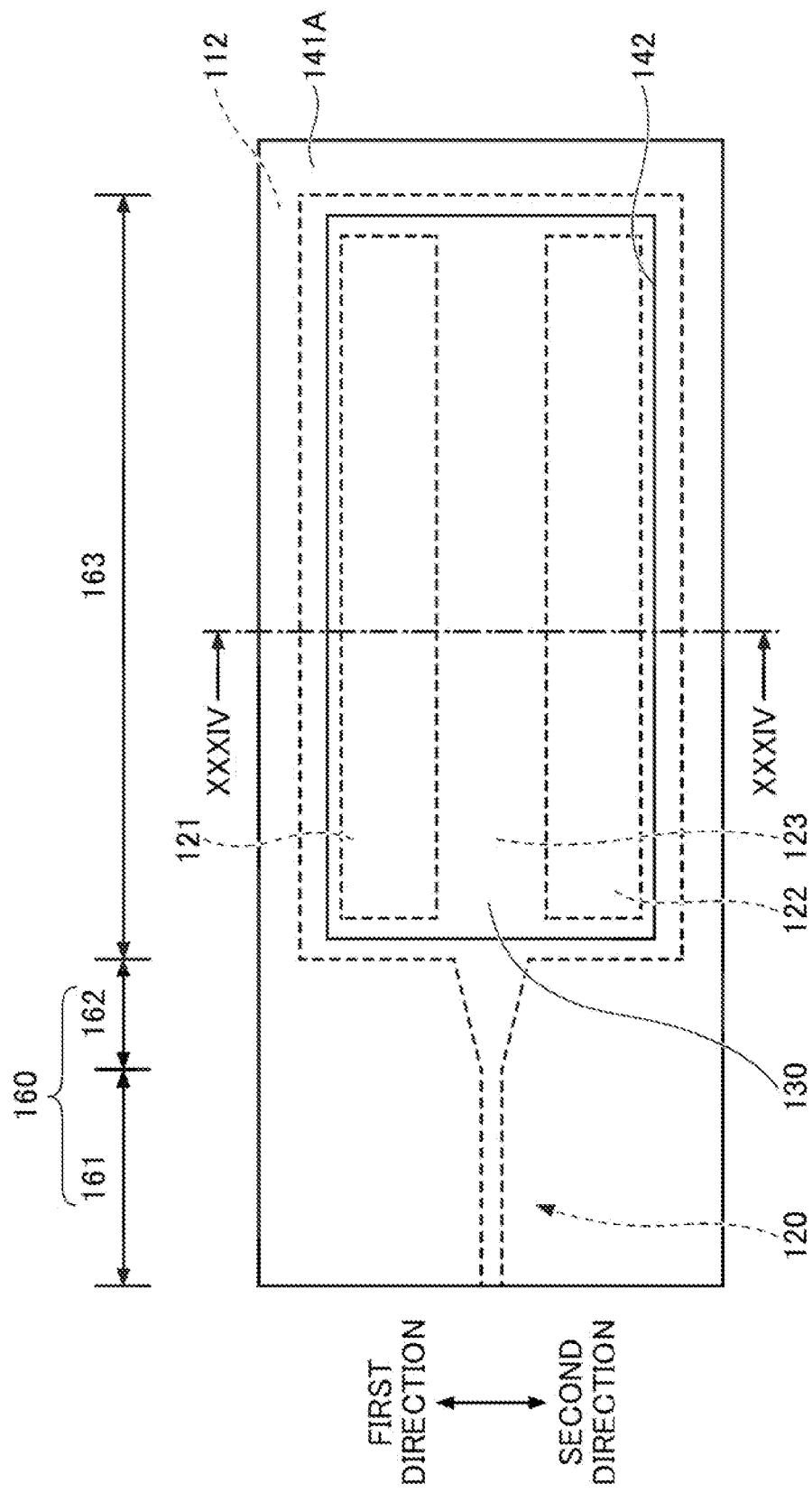
FIG. 19 is a top view (7) illustrating the method for fabricating a semiconductor photodetector according to the first embodiment.
Figure 34:
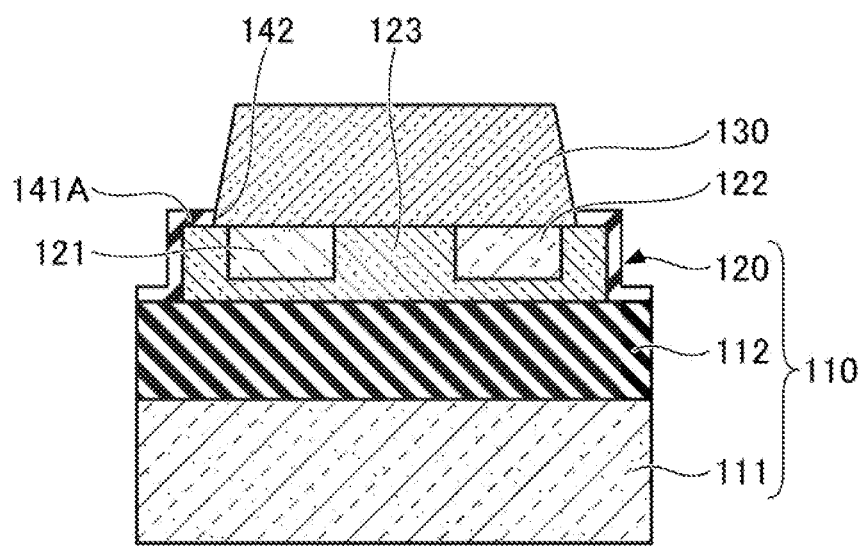
FIG. 34 is a cross-sectional view (7) illustrating the method for fabricating a semiconductor photodetector according to a first embodiment.

Then, as illustrated in FIGS. 19 and 34, a Ge layer 130 is formed on the Si layer 120 inside the opening 142. The Ge layer 130 may be formed, for example, by the low pressure (LP) CVD process, with a thickness of 400 nm to 600 nm. For example, the Ge layer 130 is heteroepitaxially grown to be a mesa-like shape. FIG. 34 corresponds to a cross-sectional view along the XXXIV-XXXIV line in FIG. 19.

Figure 20:
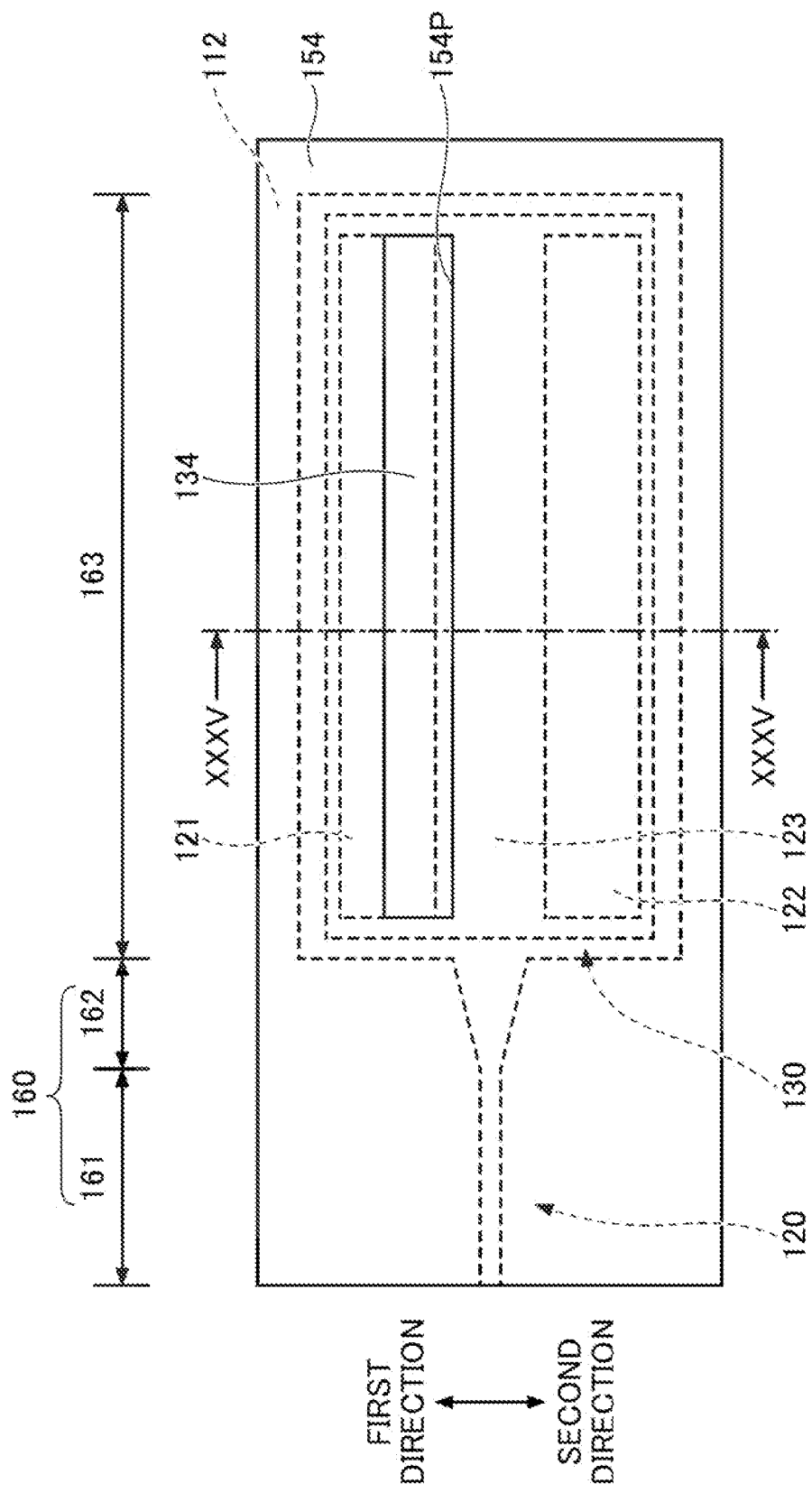
FIG. 20 is a top view (8) illustrating the method for fabricating a semiconductor photodetector according to the first embodiment.
Figure 35:
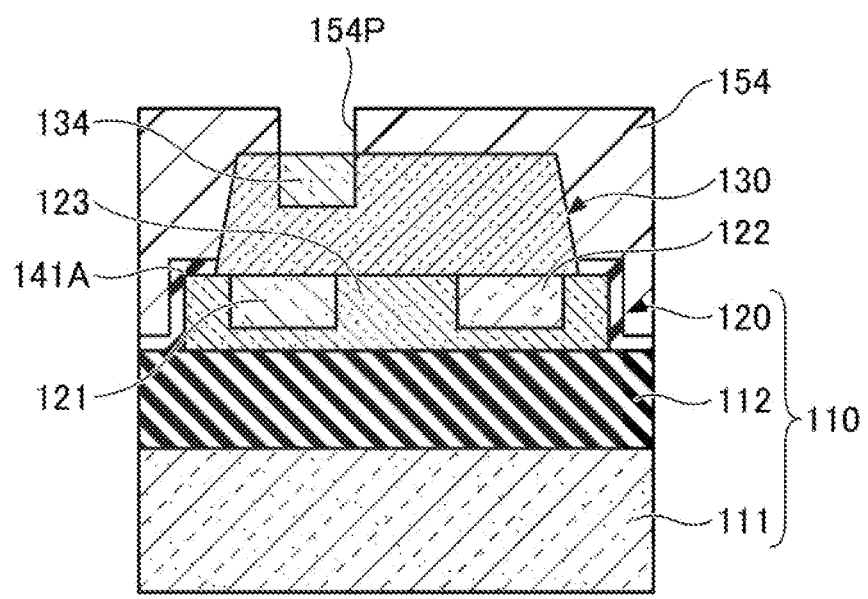
FIG. 35 is a cross-sectional view (8) illustrating the method for fabricating a semiconductor photodetector according to the first embodiment.

Then, as illustrated in FIGS. 20 and 35, a photoresist mask 154 having an opening 154P that opens a region intended to form the p-type Ge region 134 is formed on the Si oxide film 141A and on the Ge layer 130. The photoresist mask 154 can be formed by coating, exposing, and developing a photoresist agent. Thereafter, the p-type Ge region 134 is formed in the Ge layer 130 by ion implantation of a p-type impurity such as boron. FIG. 35 corresponds to a cross-sectional view along the XXXV-XXXV line in FIG. 20.

Figure 21:
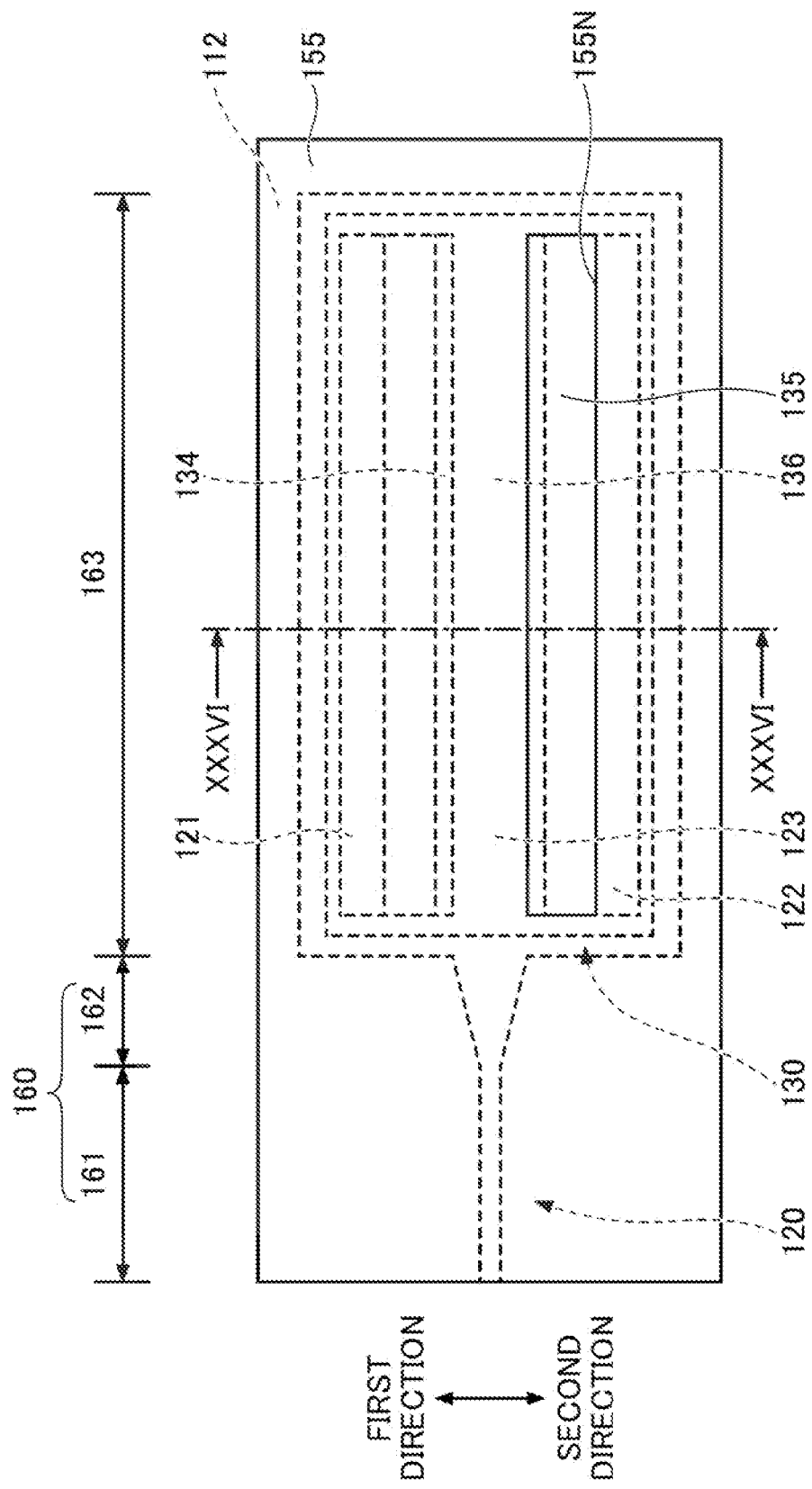
FIG. 21 is a top view (9) illustrating the method for fabricating a semiconductor photodetector according to the first embodiment.
Figure 36:
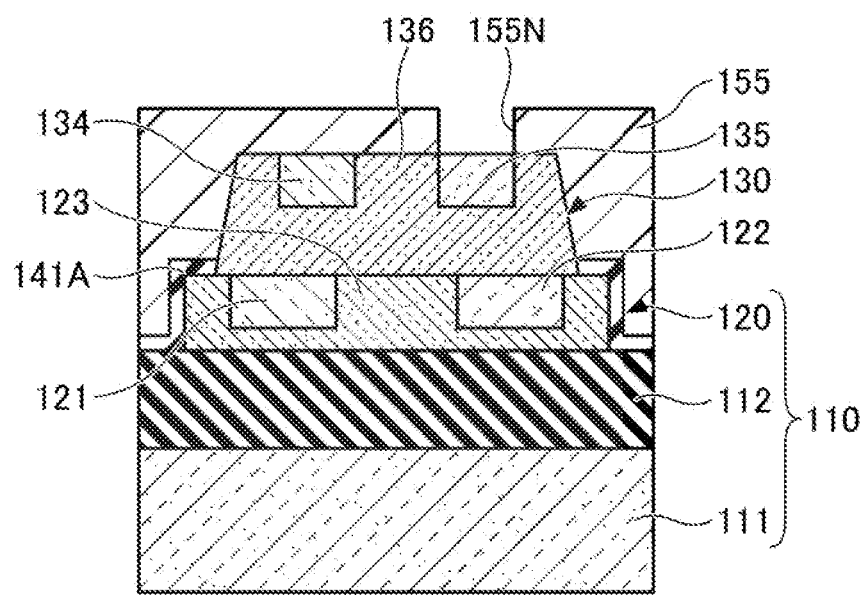
FIG. 36 is a cross-sectional view (9) illustrating the method for fabricating a semiconductor photodetector according to a first embodiment.

Subsequently, as illustrated in FIGS. 21 and 36, the photoresist mask 154 is removed, and a photoresist mask 155 having an opening 155N that opens a region intended to form an n-type Ge region 135 is formed on the Si oxide film 141A and on the Ge layer 130. The photoresist mask 155 can be formed by coating, exposing, and developing a photoresist agent. Then, the n-type Ge region 135 is formed in the Ge layer 130 by ion implantation of an n-type impurity such as phosphorus. The remaining portion of the Ge layer 130 is the i-type Ge region 136. FIG. 36 corresponds to a cross-sectional view along the XXXVI-XXXVI line in FIG. 21.

Figure 22:
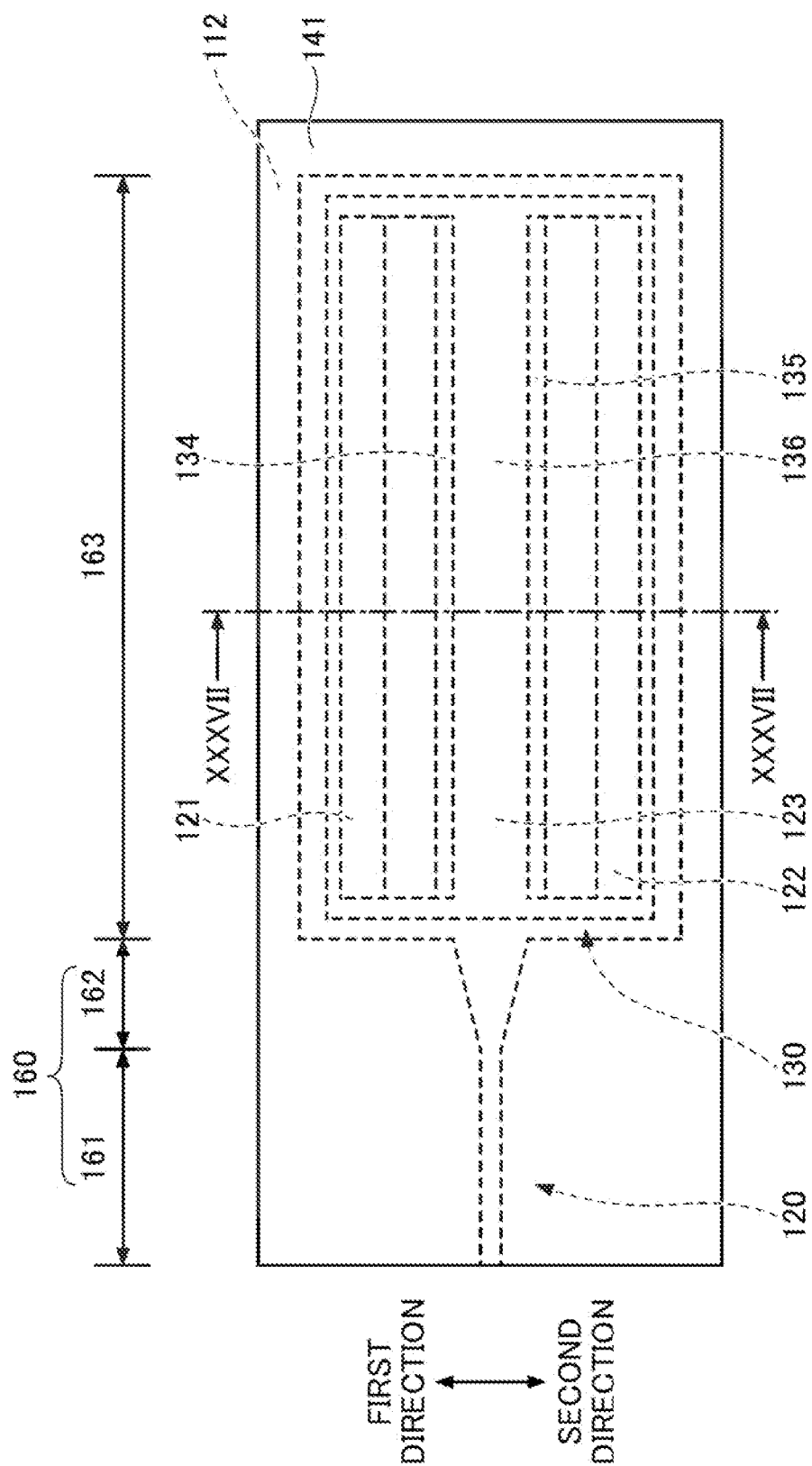
FIG. 22 is a top view (10) illustrating the method for fabricating a semiconductor photodetector according to the first embodiment.
Figure 37:
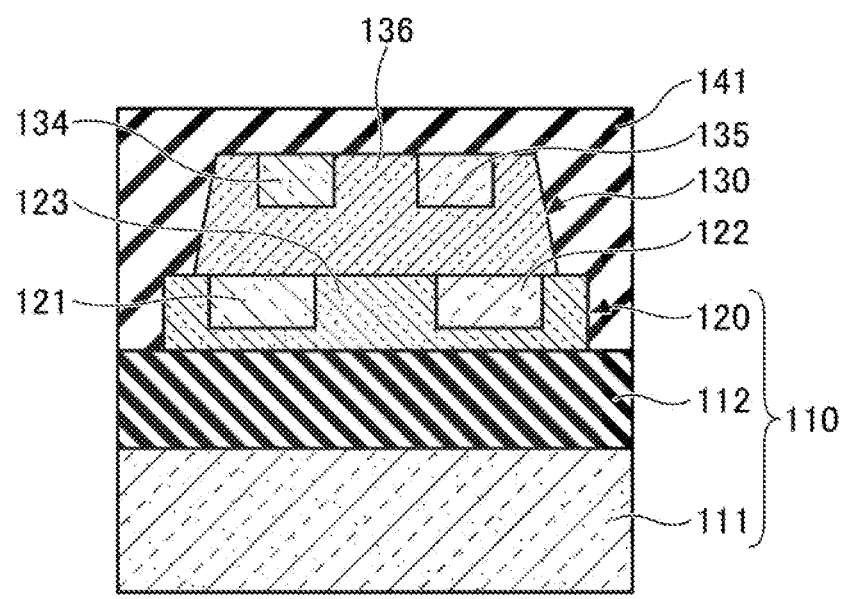
FIG. 37 is a cross-sectional view (10) illustrating the method for fabricating a semiconductor photodetector according to a first embodiment.

Thereafter, as illustrated in FIGS. 22 and 37, the photoresist mask 155 is removed, and a Si oxide film is formed on the Si oxide film 141A so as to cover the Ge layer 130 by, for example, the CVD process to form a Si oxide film 141 containing the Si oxide film 141A. Subsequently, annealing activates p-type and n-type impurities implanted into the Ge layer 130. The annealing is carried out at a temperature of, for example, 500° C. to 700° C., for a period of 5 seconds to 15 seconds. FIG. 37 corresponds to a cross-sectional view along the XXXVII-XXXVII line in FIG. 22.

Figure 23:
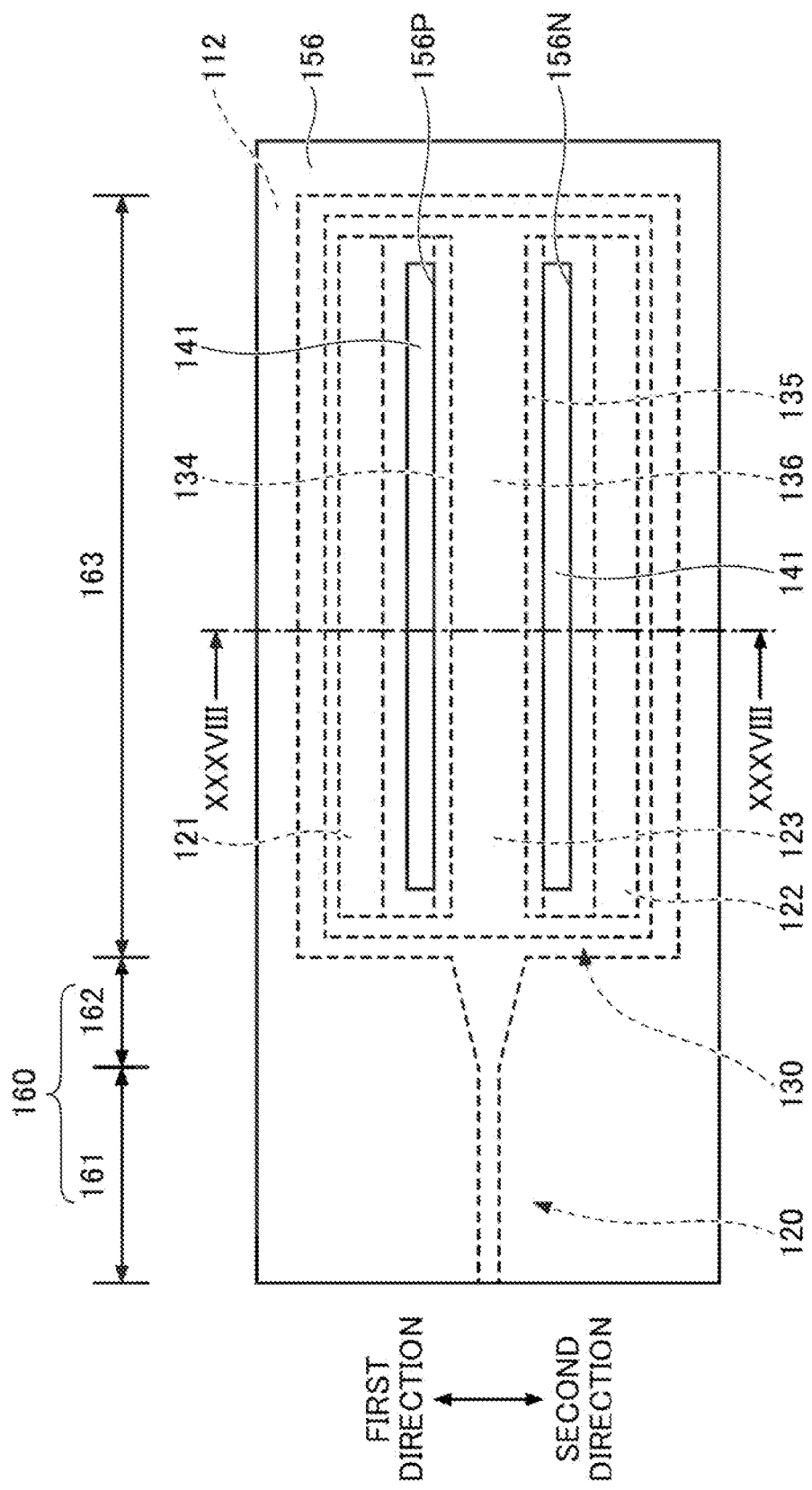
FIG. 23 is a top view (11) illustrating the method for fabricating a semiconductor photodetector according to the first embodiment.
Figure 38:
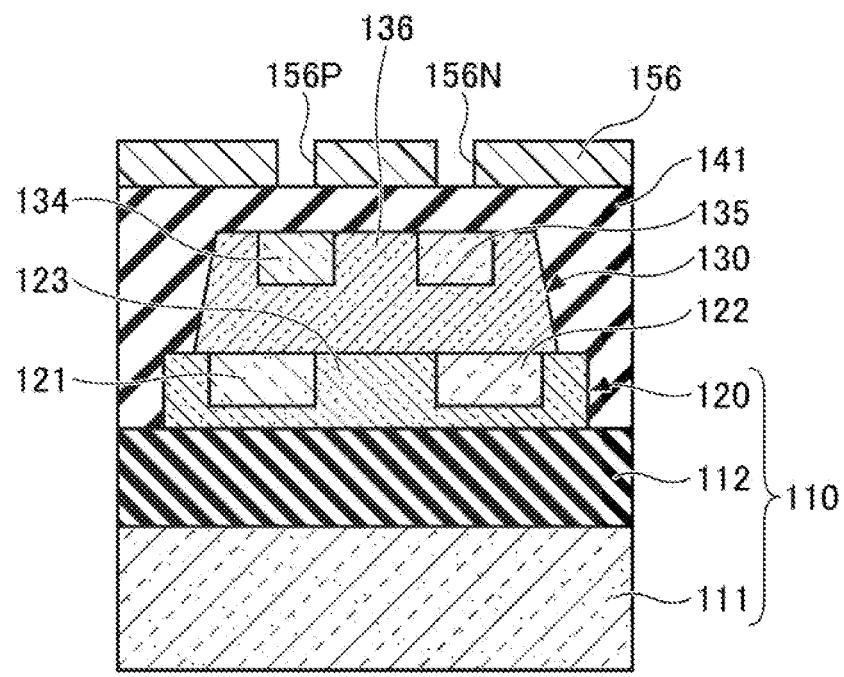
FIG. 38 is a cross-sectional view (11) illustrating the method for fabricating a semiconductor photodetector according to the first embodiment.

Then, as illustrated in FIGS. 23 and 38, a photoresist mask 156 is formed on the Si oxide film 141, where the photoresist mask 156 has an opening 156P that opens a region intended to form the opening 141P and an opening 156N that opens a region intended to form the opening 141N. The photoresist mask 156 can be formed by coating, exposing, and developing a photoresist agent. FIG. 38 corresponds to a cross-sectional view along the XXXVIII-XXXVIII line in FIG. 23.

Figure 24:
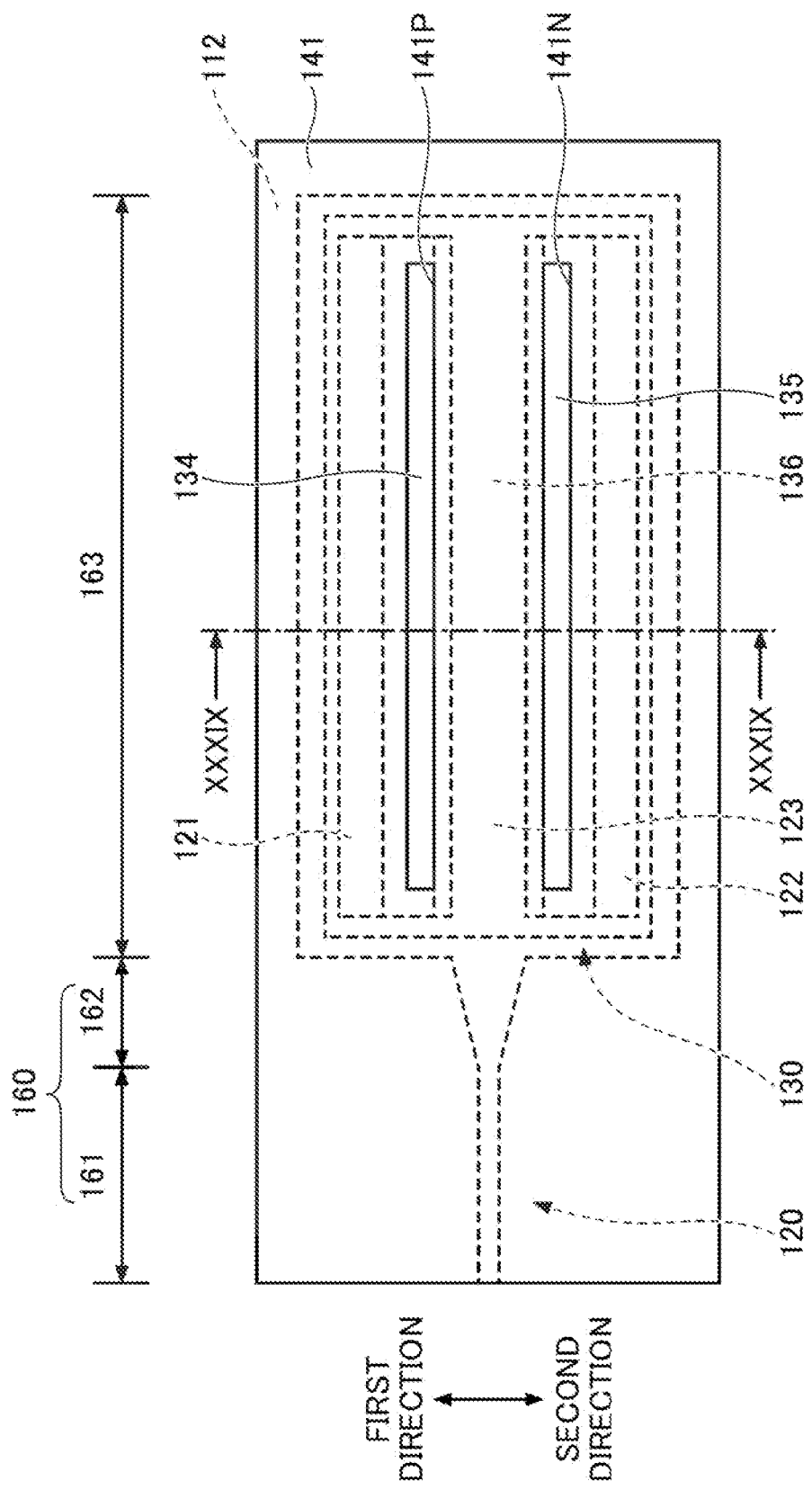
FIG. 24 is a top view (12) illustrating the method for fabricating a semiconductor photodetector according to the first embodiment.
Figure 39:
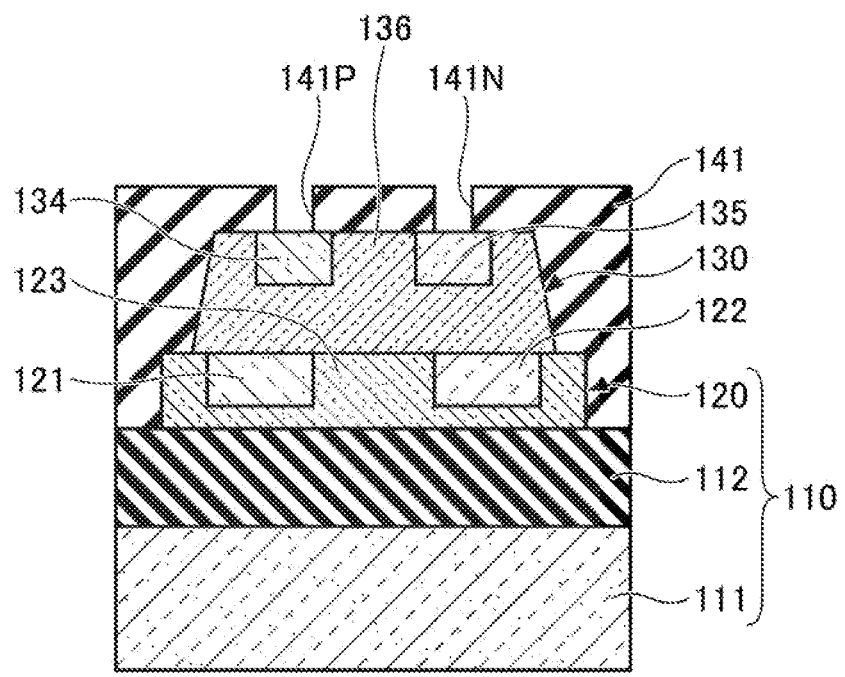
FIG. 39 is a cross-sectional view (12) illustrating the method for fabricating a semiconductor photodetector according to a first embodiment.

Then, as illustrated in FIGS. 24 and 39, an opening 141P reaching the p-type Ge region 134 and an opening 141N reaching the n-type Ge region 135 are formed in the Si oxide film 141. The opening 141P and the opening 141N may be formed, for example, by dry etching. The photoresist mask 156 is then removed. FIG. 39 corresponds to a cross-sectional view along the XXXIX-XXXIX line in FIG. 24.

Figure 25:
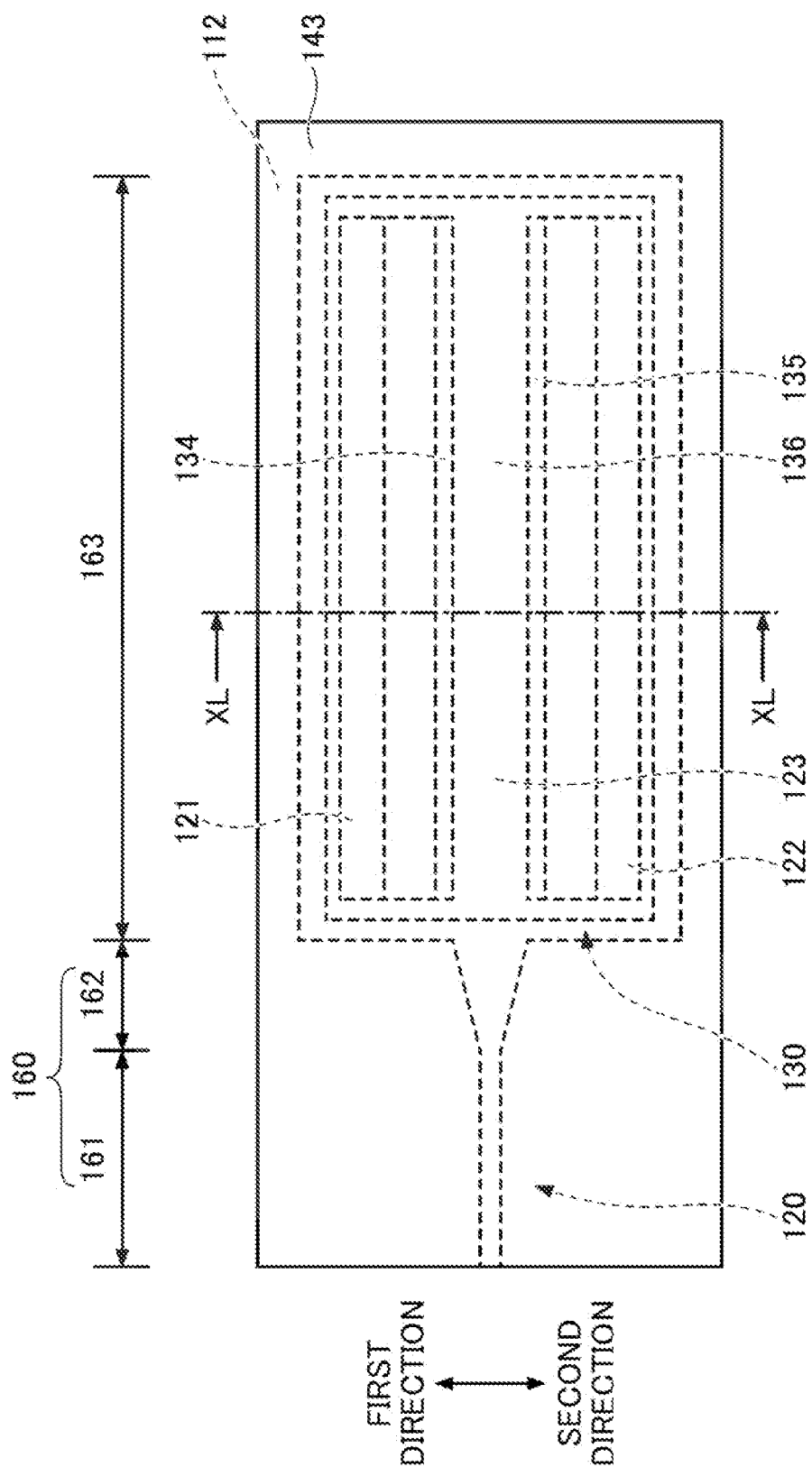
FIG. 25 is a top view (13) illustrating the method for fabricating a semiconductor photodetector according to the first embodiment.
Figure 40:
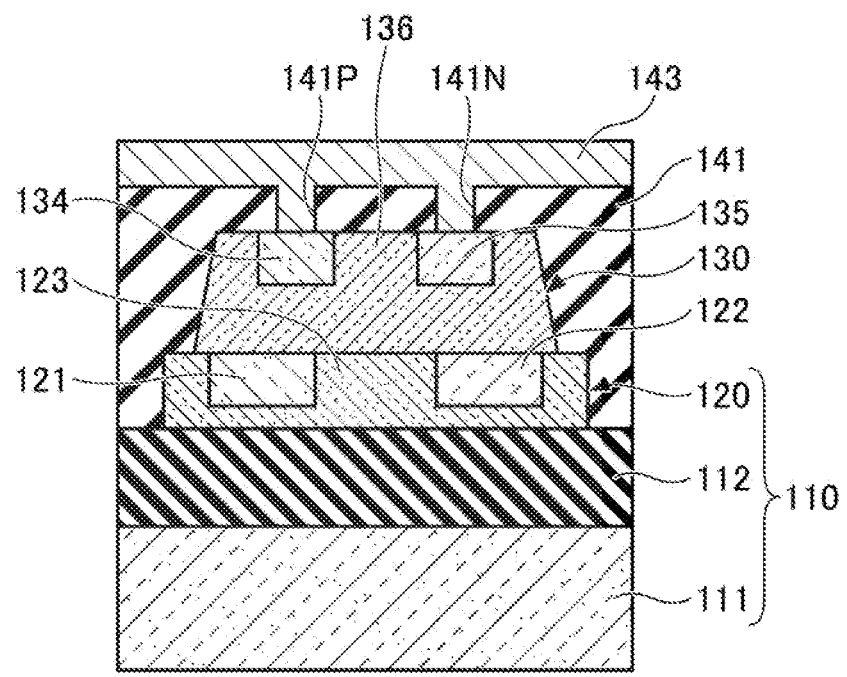
FIG. 40 is a cross-sectional view (13) illustrating the method for fabricating a semiconductor photodetector according to a first embodiment.

Then, as illustrated in FIGS. 25 and 40, the opening 141P and the opening 141N are filled to form a metal film 143 on the Si oxide film 141. As a metal film 143, for example, an aluminum film is formed by the sputtering process. FIG. 40 corresponds to a cross-sectional view along the XL-XL line in FIG. 25.

Figure 26:
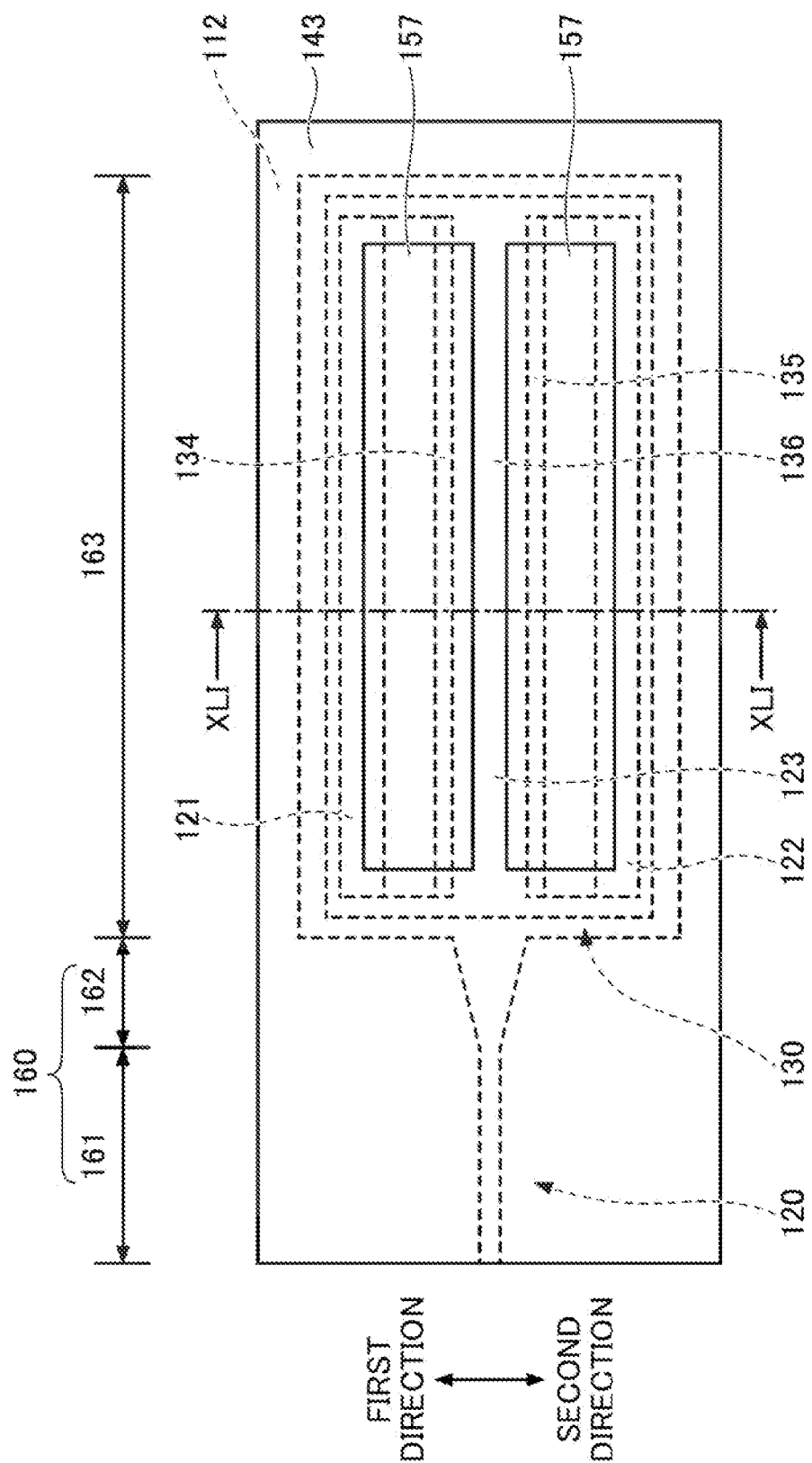
FIG. 26 is a top view (14) illustrating the method for fabricating a semiconductor photodetector according to the first embodiment.
Figure 41:
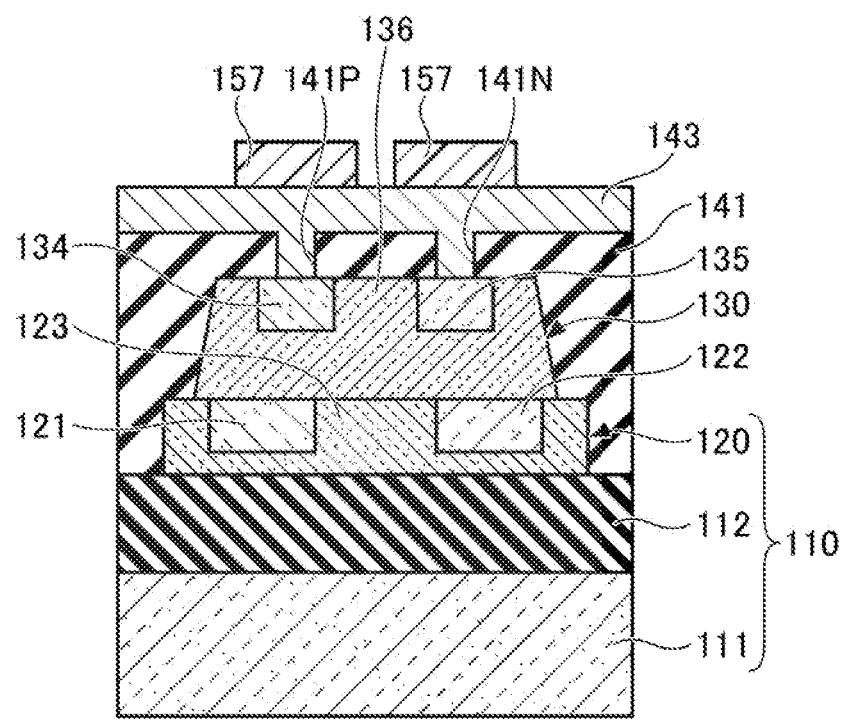
FIG. 41 is a cross-sectional view (14) illustrating the method for fabricating a semiconductor photodetector according to a first embodiment.

Then, as illustrated in FIGS. 26 and 41, a photoresist mask 157 is formed to cover a region intended to form the metal film 143P and a region intended to form the metal film 143N. The photoresist mask 157 can be formed by coating, exposing, and developing a photoresist agent. FIG. 41 corresponds to a cross-sectional view along the XLI-XLI line in FIG. 26.

Figure 27:
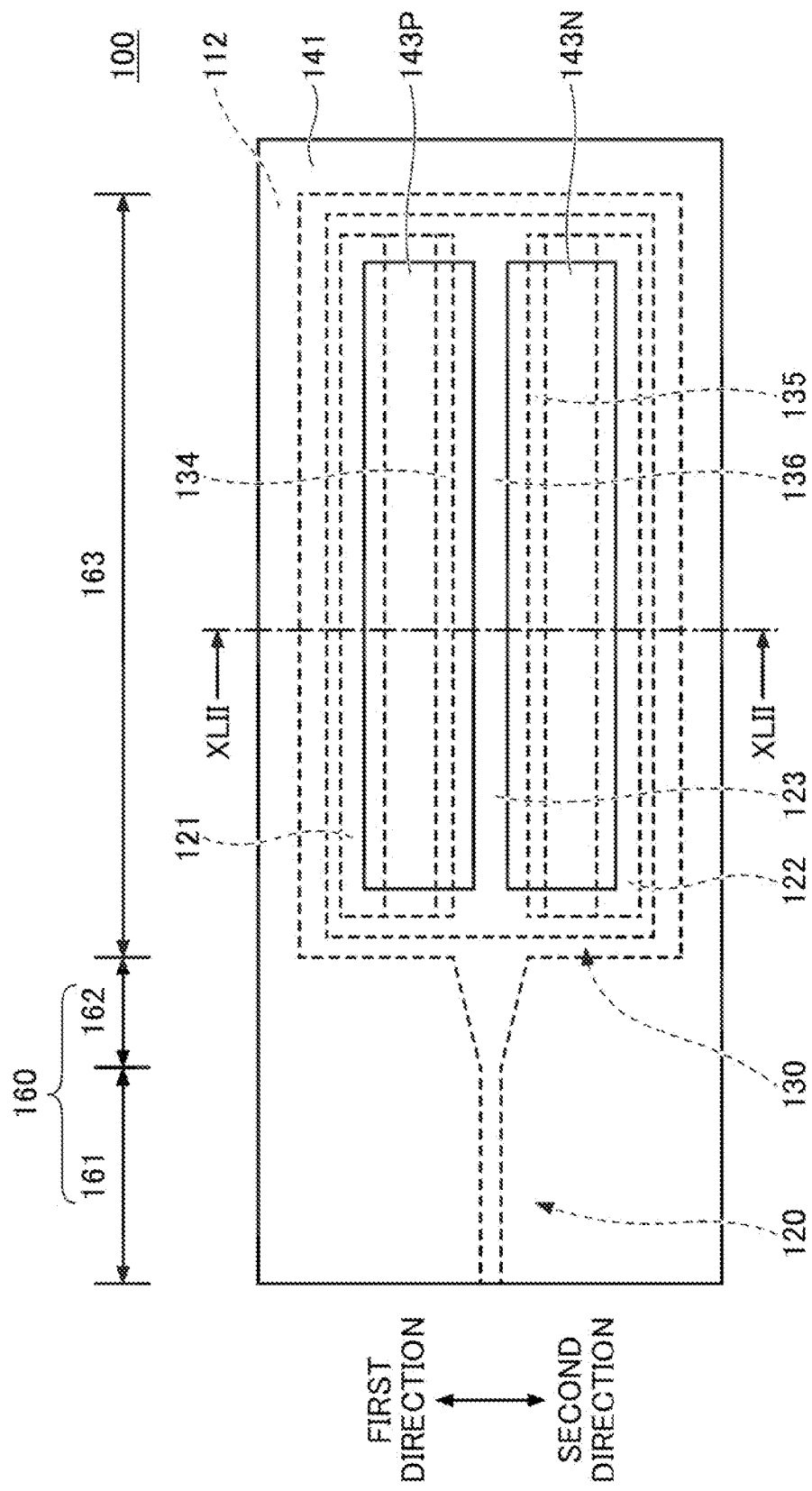
FIG. 27 is a top view (15) illustrating the method for fabricating a semiconductor photodetector according to the first embodiment.
Figure 42:
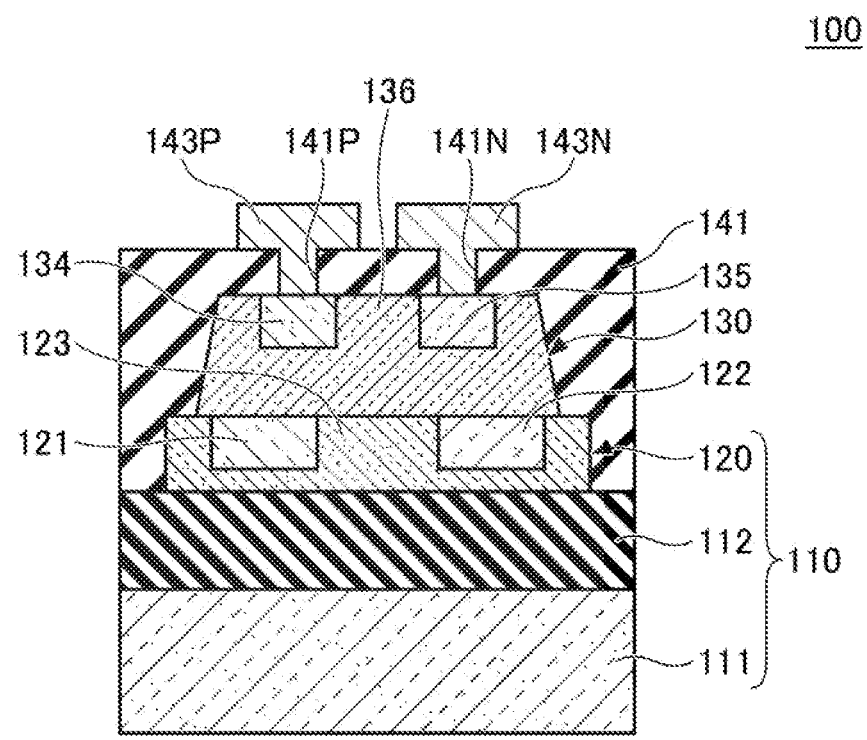
FIG. 42 is a cross-sectional view (15) illustrating the method for fabricating a semiconductor photodetector according to the first embodiment.

The metal film 143P and the metal film 143N are then formed by dry etching of the metal film 143 as illustrated in FIGS. 27 and 42. The photoresist mask 157 is then removed. FIG. 42 corresponds to a cross-sectional view along the XLII-XLII line in FIG. 27.

The semiconductor photodetector 100 according to the first embodiment can be fabricated in this manner.

Second Embodiment

Figure 43:
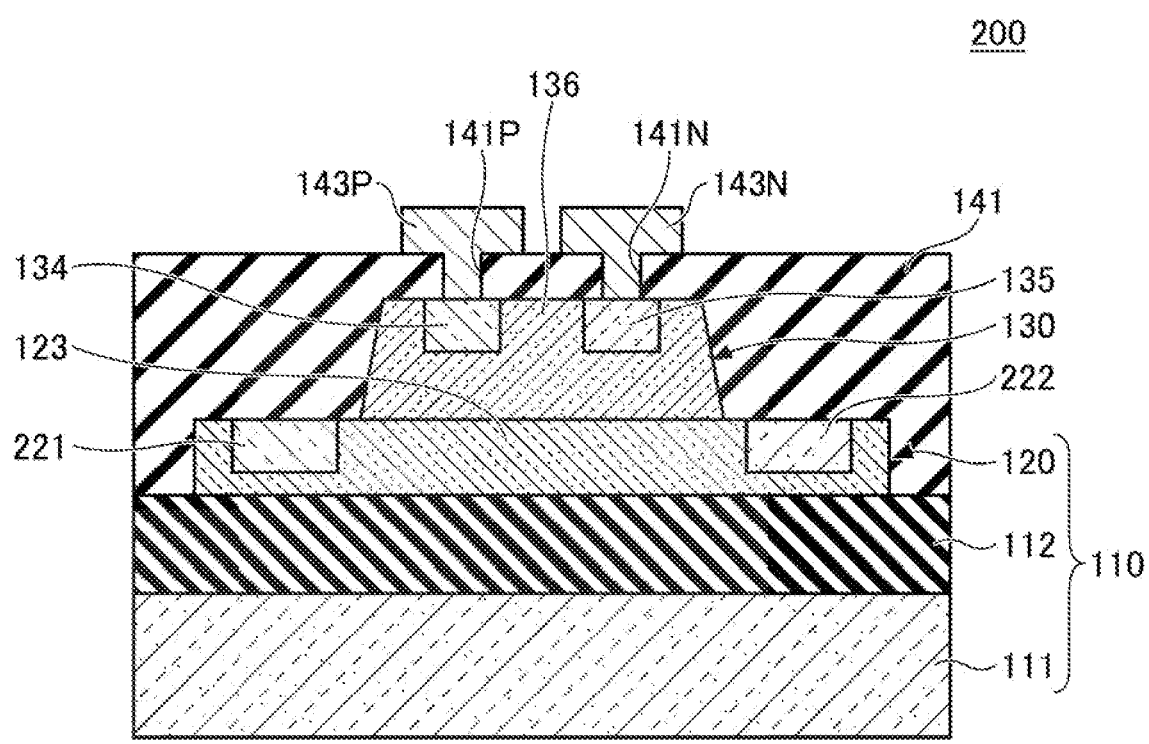
FIG. 43 is a cross-sectional view illustrating a configuration of a semiconductor photodetector according to a second embodiment.

Next, a second embodiment will be described. The second embodiment differs from the first embodiment primarily in terms of the Si layer configuration. FIG. 43 is a cross-sectional view illustrating a configuration of a semiconductor photodetector according to the second embodiment. FIG. 43, like FIG. 5, corresponds to a cross-sectional view along the V-V line in FIGS. 3 and 4.

As illustrated in FIG. 43, in the semiconductor photodetector 200 according to the second embodiment, the Si layer 120 has a p-type Si region 221 in place of the p-type Si region 121, and an n-type Si region 222 in place of the n-type Si region 122. The p-type Si region 221 and the n-type Si region 222 are formed on the top surface of the i-type Si region 123. The p-type Si region 221 and the n-type Si region 222 are separated from each other in a direction perpendicular to the propagation direction of light guided from the light introduction portion 160 to the photoelectric converter portion 163. A portion of the i-type Si region 123 is interposed between the p-type Si region 221 and the n-type Si region 222. The p-type Si region 221 is located in the first direction in viewing from the i-type Si region 123, and the n-type Si region 222 is located in the second direction in viewing from the i-type Si region 123. For example, the p-type Si region 221 contains boron at a concentration of $0.5 \times 10^{19}$ $cm^{-3}$ to $1.5 \times 10^{19}$ $cm^{-3}$. For example, the n-type Si region 222 contains phosphorus at a concentration of $0.5 \times 10^{19}$ $cm^{-3}$ to $1.5 \times 10^{19}$ $cm^{-3}$. The p-type Si region 221 is an example of the first region, the n-type Si region 222 is an example of the second region, and the i-type Si region 123 is an example of the third region.

In the semiconductor photodetector 200, the p-type Si region 221 is separated from the p-type Ge region 134 in the first direction, and the n-type Si region 222 is separated from the n-type Ge region 135 in the second direction, in a plan view. For example, the p-type Si region 221 is located more toward the first direction relative to the Ge layer 130, and the n-type Si region 222 is located more toward the second direction relative to the Ge layer 130. Thus, the p-type Si region 221 and the n-type Si region 222 are not covered by the Ge layer 130.

Other configurations are similar to those of the first embodiment.

The second embodiment has the same effect as in the first embodiment. In addition, even when the guided light 191 is distributed within the Si layer 120, the p-type Si region 221 and the n-type Si region 222 are separated from the region having the strong guided light 191. Thus, free carrier absorption in the Si layer is further reduced.

Third Embodiment

Figure 44:
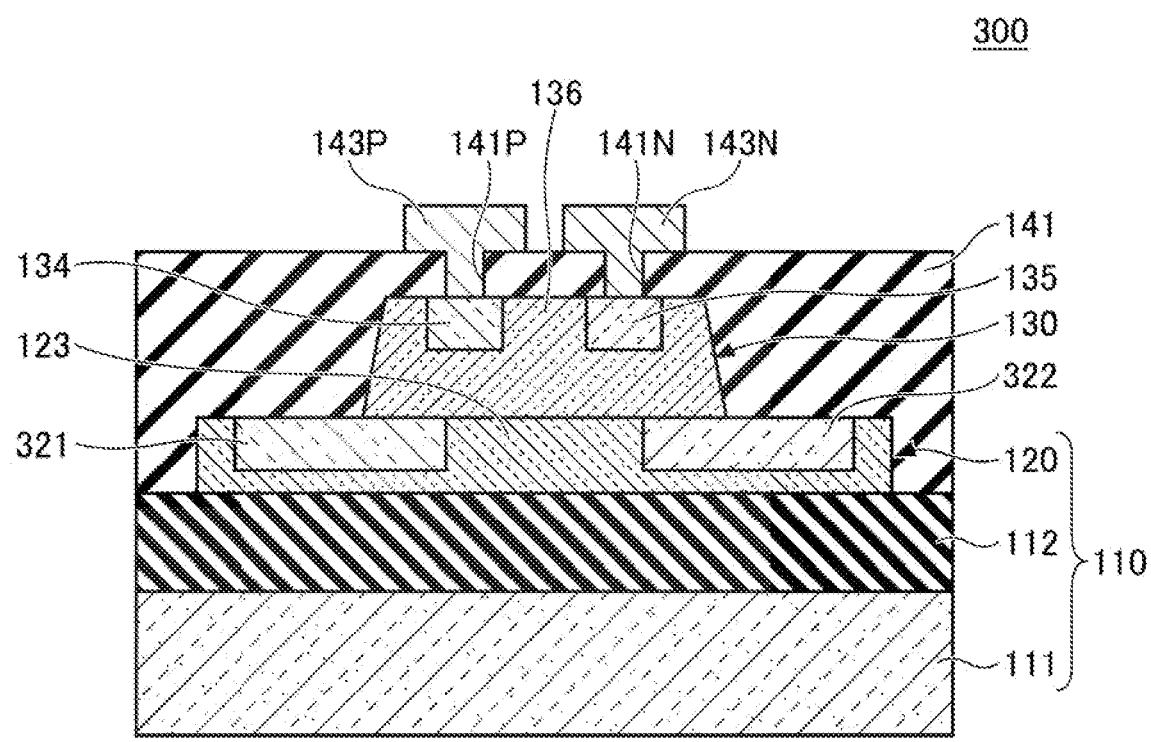
FIG. 44 is a cross-sectional view illustrating a configuration of a semiconductor photodetector according to a third embodiment.

Next, a third embodiment will be described. The third embodiment differs from the first embodiment, and the like, mainly in terms of the structure of the Si layer. FIG. 44 is a cross-sectional view illustrating a configuration of a semiconductor photodetector according to the third embodiment. FIG. 44, like FIG. 5, corresponds to a cross-sectional view along the V-V line in FIGS. 3 and 4.

As illustrated in FIG. 44, in the semiconductor photodetector 300 according to the third embodiment, the Si layer 120 has a p-type Si region 321 in place of the p-type Si region 121 and an n-type Si region 322 in place of the n-type Si region 122. The p-type Si region 321 and the n-type Si region 322 are formed on the top surface of the i-type Si region 123. The p-type Si region 321 and the n-type Si region 322 are separated from each other in a direction perpendicular to the propagation direction of light guided from the light introduction portion 160 to the photoelectric converter portion 163. A portion of the i-type Si region 123 is interposed between the p-type Si region 321 and the n-type Si region 322. The p-type Si region 321 is located in the first direction in viewing from the i-type Si region 123 and the n-type Si region 322 is located in the second direction in viewing from the i-type Si region 123. For example, p-type Si region 321 contains boron at a concentration of $0.5 \times 10^{19}$ cm$^{-3}$ to $1.5 \times 10^{19}$ cm$^{-3}$. For example, the n-type Si region 322 contains phosphorus at a concentration of $0.5 \times 10^{19}$ cm$^{-3}$ to $1.5 \times 10^{19}$ cm$^{-3}$. The p-type Si region 321 is an example of the first region, the n-type Si region 322 is an example of the second region, and the i-type Si region 123 is an example of the third region.

In the semiconductor photodetector 300, the p-type Si region 321 is disposed in a direction from inside toward outside of the Ge layer 130, and the n-type Si region 322 is disposed in a direction from inside toward outside of the Ge layer 130, in a plan view. The p-type Si region 321 and the n-type Si region 322 both have areas covered and uncovered by the Ge layer 130. In a direction parallel to the first and second directions, the p-type Si region 321 is formed larger than the p-type Si region 121, and the n-type Si region 322 is formed larger than the n-type Si region 122.

In a planar view, a first edge of the p-type Ge region 134 or the p-type Si region 321 indicates an edge located toward the first direction on the far side of the i-type Ge region 136 or the i-type Si region 123, and a second edge of the p-type Ge region 134 or the p-type Si region 321 indicates an edge located toward the second direction on the far side of the i-type Ge region 136 or the i-type Si region 123. In a plan view, the distance between the second edge of the p-type Si region 321 and the second edge of the p-type Ge region 134 is greater than the distance between the second edge of the p-type Si region 121 and the second edge of the p-type Ge region 134 in the first embodiment. In a plan view, the distance between the first edge of the n-type Si region 322 and the first edge of the n-type Ge region 135 is greater than the distance between the first edge of the n-type Si region 122 and the first edge of the n-type Ge region 135 in the first embodiment.

Other configurations are similar to those of the first embodiment.

The third embodiment has the same effect as in the first embodiment. Similar to the second embodiment, the free carrier absorption in the p-type Si region 321 and the n-type Si region 322 is easily reduced.

Depending on the application of the semiconductor photodetector, it is desirable to select an arrangement of the p-type Si region and the n-type Si region in consideration of the improvement of the electric field intensity due to the p-type Si region and the n-type Si region and of the reduction in free carrier absorption in the p-type Si region and the n-type Si region.

Fourth Embodiment

Figure 45:
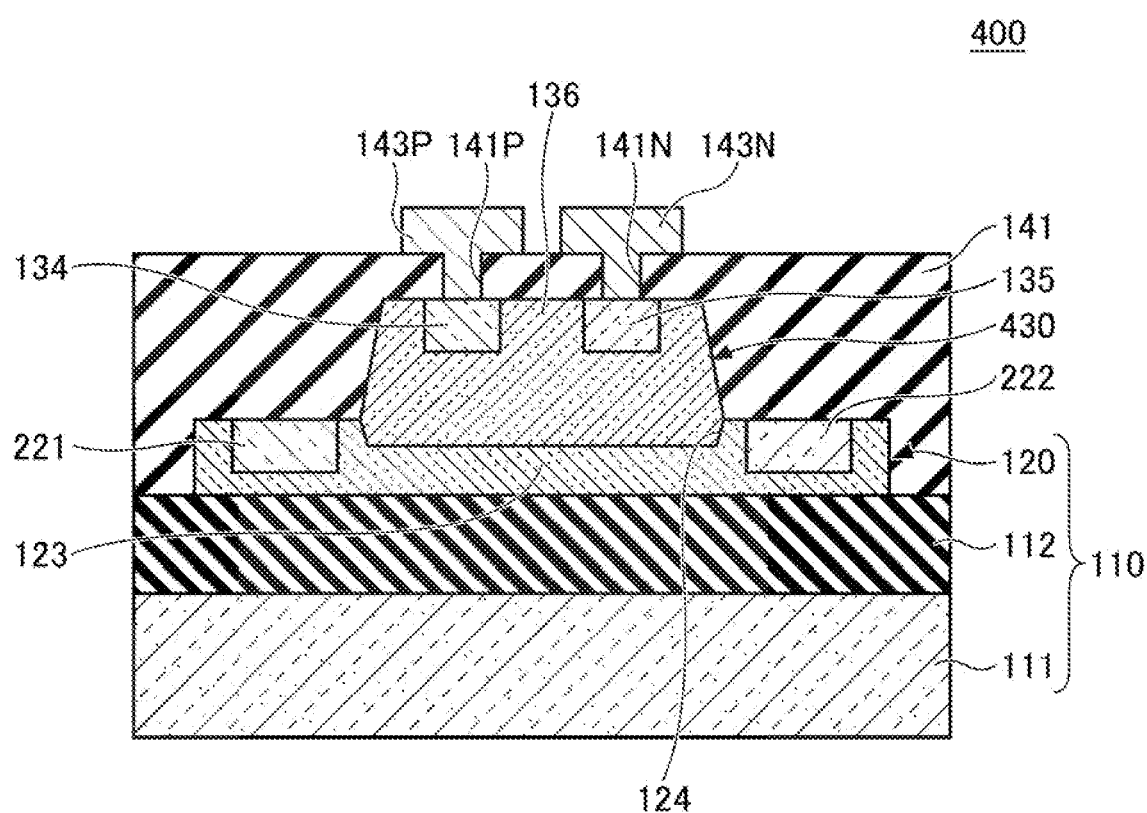
FIG. 45 is a cross-sectional view illustrating a configuration of a semiconductor photodetector according to a fourth embodiment.

Next, a fourth embodiment will be described. The fourth embodiment differs from the second embodiment primarily in terms of Si and Ge layer configurations. FIG. 45 is a cross-sectional view illustrating a configuration of a semiconductor photodetector according to the fourth embodiment. FIG. 45, like FIG. 5, corresponds to a cross-sectional view along the V-V line in FIGS. 3 and 4.

As illustrated in FIG. 45, in the semiconductor photodetector 400 according to the fourth embodiment, a recess 124 is formed in the i-type Si region 123 between the p-type Si region 221 and the n-type Si region 222, and a Ge layer 430 is formed to fill the recess 124 instead of the Ge layer 130. In the fourth embodiment, in a plan view, a light guiding layer of the light introduction portion 160 and a light absorbing layer of the photoelectric converter portion 163 are located at the same level of height, and the guided light is directly introduced into the light absorbing layer. That is, the semiconductor photodetector 400 utilizes a butt-joint optical coupling. For example, the recess 124 may be between 80 nm and 120 nm in depth. The thickness of the Si layer 120 is thinner in a portion where the recess 124 is formed than in a portion surrounding the recess 124.

Other configurations are similar to those of the second embodiment.

The fourth embodiment has the same effect as in the second embodiment. Since the Ge layer 430 includes a portion located between the p-type Si region 221 and the n-type Si region 222 in a direction parallel to the first direction and the second direction, an electric field is easily applied from the p-type Si region 221 and the n-type Si region 222 to a region in which the intensity of the guided light is high. Accordingly, the operation speed can be improved.

Figure 46:
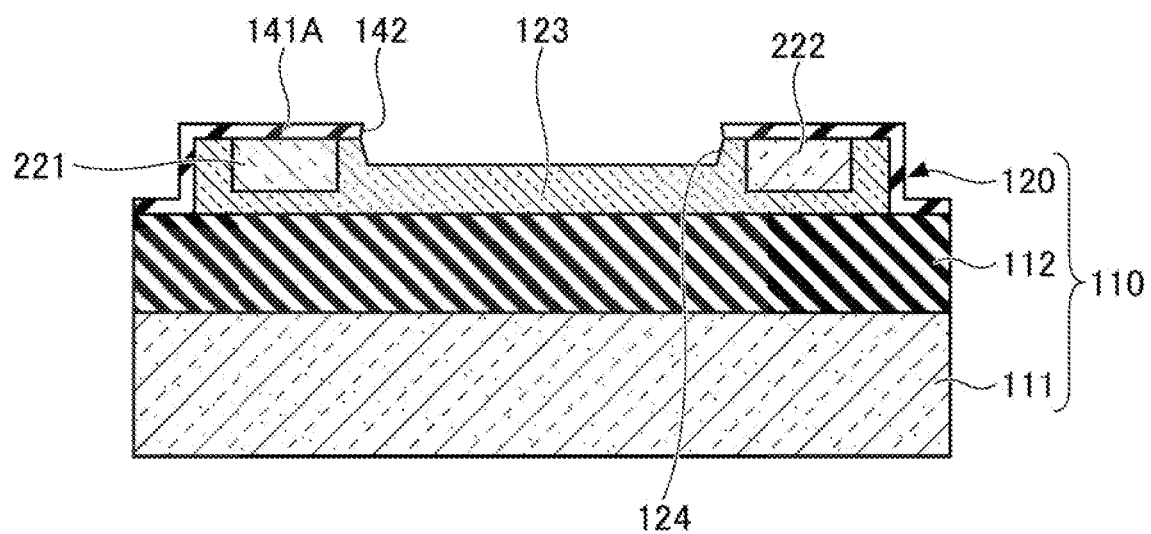
FIG. 46 is a cross-sectional view (1) illustrating a method for fabricating a semiconductor photodetector according to the fourth embodiment.
Figure 47:
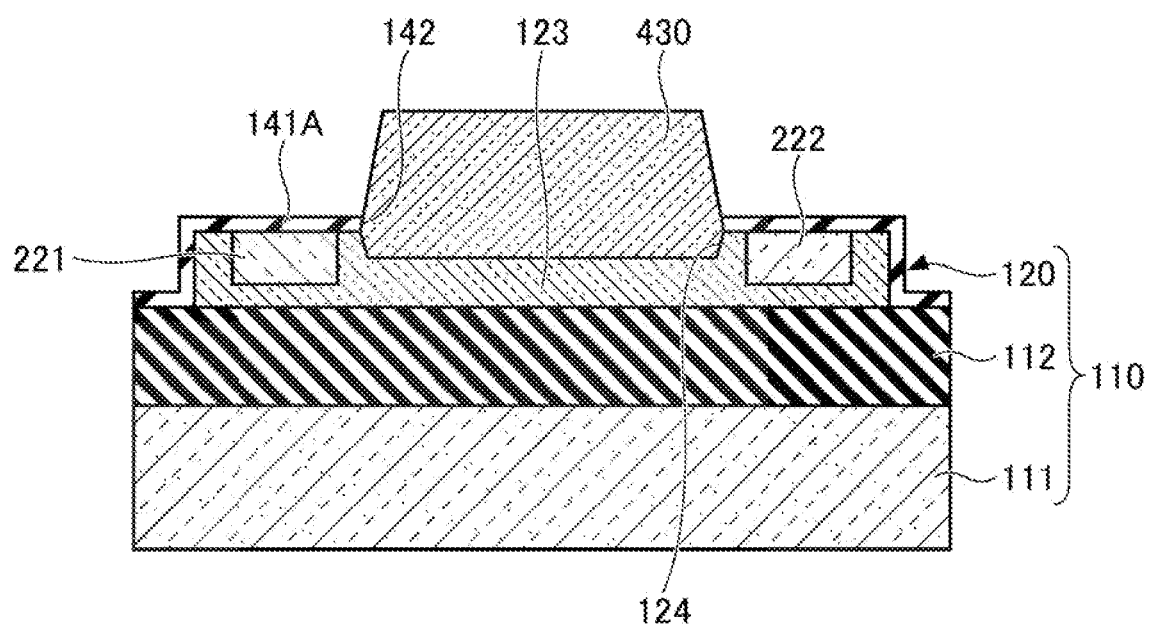
FIG. 47 is a cross-sectional view (2) illustrating the method for fabricating a semiconductor photodetector according to the fourth embodiment.

Next, a method for fabricating the semiconductor photodetector 400 according to the fourth embodiment will be described. FIGS. 46 and 47 are cross-sectional views illustrating a method for fabricating the semiconductor photodetector 400 according to the fourth embodiment.

First, as in the first embodiment, the process up to the formation of the opening 142 in the Si oxide film 141A is performed. The photoresist mask 153 is then removed (see FIG. 33). Note that the p-type Si region 221 can be formed by differentiating a position and a shape of the opening 151P of the photoresist mask 151, and the n-type Si region 222 can be formed by differentiating a position and a shape of the opening 152N of the photoresist mask 152. Thereafter, as illustrated in FIG. 46, the recess 124 is formed by etching the Si layer 120 using the Si oxide film 141A as a mask. The recess 124 may be formed, for example, by ICP dry etching.

The Ge layer 430 is then formed on the Si layer 120 to fill the recess 124, as illustrated in FIG. 47. The Ge layer 430 can be formed, for example, by the LPCVD process. For example, the Ge layer 430 is heteroepitaxially grown from the recess 124 to be a mesa-like shape.

Thereafter, as in the first embodiment, a process after the formation of the Si oxide film 141 is performed.

The semiconductor photodetector 400 according to the fourth embodiment can be fabricated in this manner.

Fifth Embodiment

Figure 48:
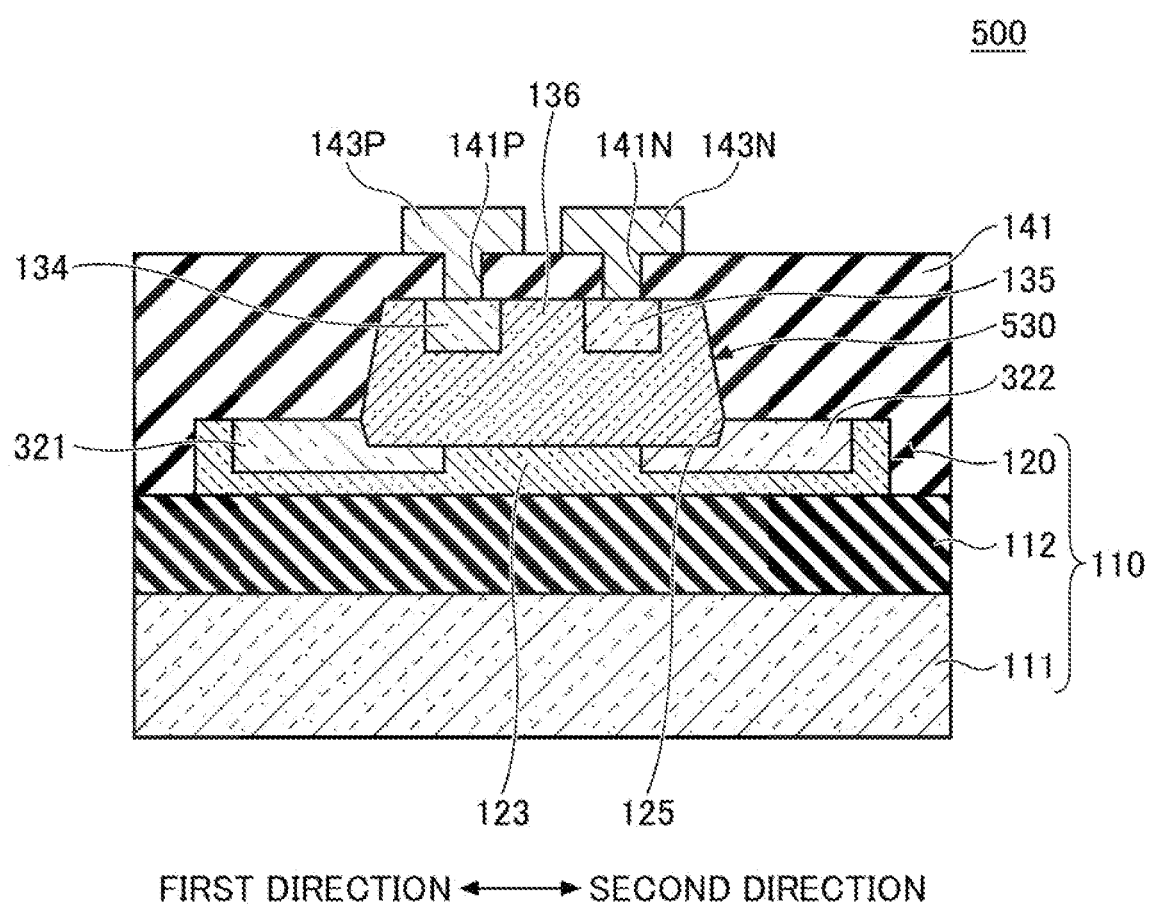
FIG. 48 is a cross-sectional view illustrating a configuration of a semiconductor photodetector according to a fifth embodiment.

Next, a fifth embodiment will be described. The fifth embodiment differs from the third embodiment primarily in terms of Si and Ge layer configurations. FIG. 48 is a cross-sectional view illustrating a configuration of a semiconductor photodetector according to the fifth embodiment. FIG. 48, like FIG. 5, corresponds to a cross-sectional view along the V-V line in FIGS. 3 and 4.

As illustrated in FIG. 48, in a semiconductor photodetector 500 according to the fifth embodiment, a recess 125 is formed in a portion of the i-type Si region 123 between the p-type Si region 321 and the n-type Si region 322, in a portion toward the second direction of the p-type Si region 321, and in a portion toward the first direction of the n-type Si region 322, and a Ge layer 530 is formed to fill the recess 125 instead of the Ge layer 130. That is, the semiconductor photodetector 500 utilizes a butt joint type optical coupling in the same manner as the fourth embodiment. For example, the recess 125 may be between 80 nm and 120 nm in depth. The thickness of the Si layer 120 is thinner in a portion where the recess 125 is formed than in a portion surrounding the recess 125.

Other configurations are the same as in the third embodiment.

The fifth embodiment has the same effect as in the third embodiment. Since the Ge layer 530 includes a portion interposed between the p-type Si region 321 and the n-type Si region 322 in the direction parallel to the first direction and the second direction, an electric field is easily applied from the p-type Si region 321 and the n-type Si region 322 to the region in which the intensity of the guided light is high. Accordingly, the operation speed can be improved.

Sixth Embodiment

Figure 49:
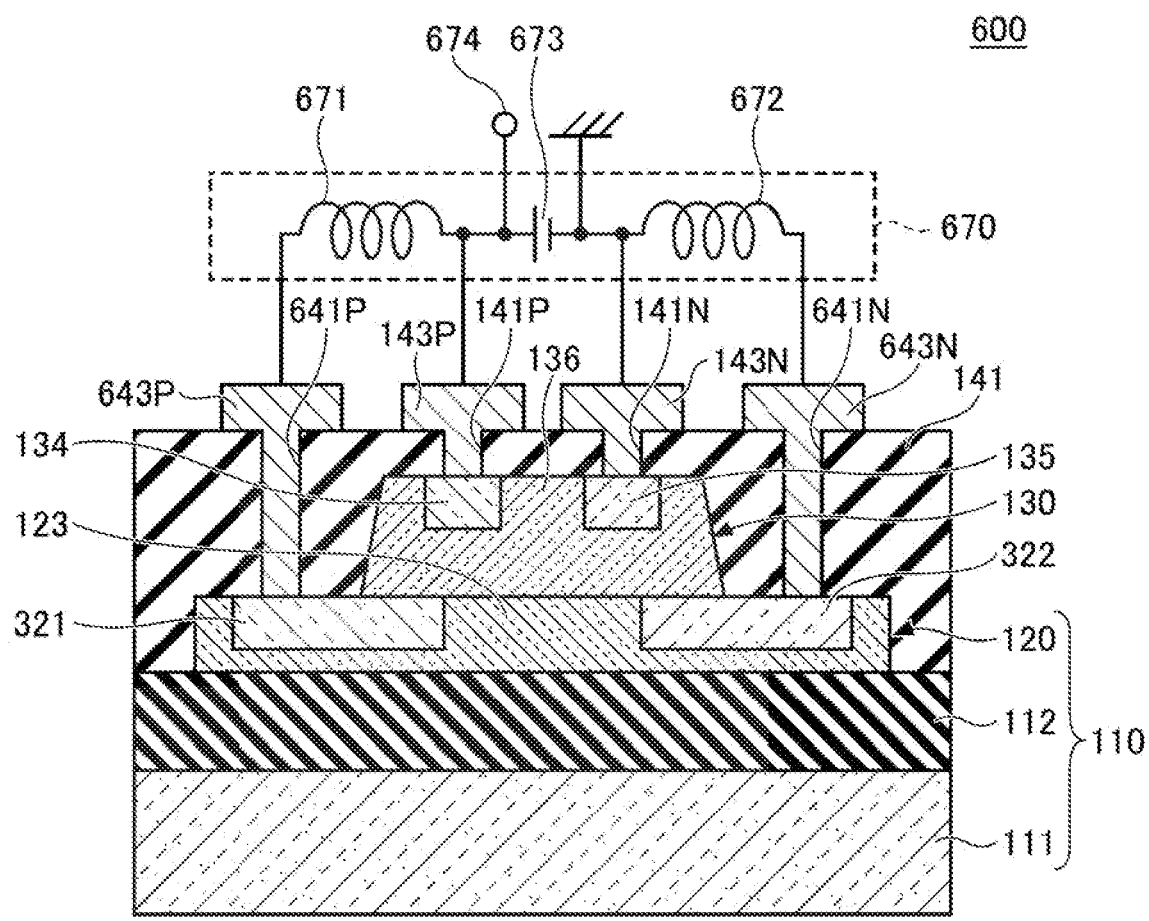
FIG. 49 is a cross-sectional view illustrating a configuration of a semiconductor photodetector according to a sixth embodiment.

Next, a sixth embodiment will be described. The sixth embodiment is different from the third embodiment in terms of the structure of the metal film. FIG. 49 is a cross-sectional view illustrating a configuration of a semiconductor photodetector according to a sixth embodiment. FIG. 49, like FIG. 5, corresponds to a cross-sectional view along the V-V line in FIGS. 3 and 4.

As illustrated in FIG. 49, in the semiconductor photodetector 600 according to the sixth embodiment, an opening 641P extending to the p-type Si region 321 and an opening 641N extending to the n-type Si region 322 are formed in the Si oxide film 141. A metal film 643P in ohmic contact with the p-type Si region 321 through the opening 641P, and a metal film 643N in ohmic contact with the n-type Si region 322 through the opening 641N are formed on the Si oxide film 141. The metal film 643P and the metal film 643N comprise, for example, aluminum (Al). The metal film 643P is an example of a third electrode and the metal film 643N is an example of a fourth electrode.

The semiconductor photodetector 600 can be used in a receiver. In this receiver, a circuit 670 is connected to the metal film 643P and the metal film 643N to apply a first voltage to the metal film 643P and a second voltage lower than the first voltage to the metal film 643N. The circuit 670 includes, for example, a first inductor 671 connected between the metal film 143P and the metal film 643P, a second inductor 672 connected between the metal film 143N and the metal film 643N, and a DC power supply 673 connected between the metal film 143P and the metal film 143N. A positive electrode of the DC power supply 673 is connected to the metal film 143P and a negative electrode is connected to the metal film 143N. The metal film 143N is grounded and an external terminal 674 is connected to the metal film 143P.

In the circuit 670, a DC voltage (bias voltage) applied from the DC power supply 673 to an interval between the metal film 643P and the metal film 643N is also applied to an interval between the metal film 143P and the metal film 143N. The high frequency component corresponding to a modulation signal generated by the photoelectric conversion by the Ge layer 130 flows between the metal film 143P and the metal film 143N, and the modulation signal can be detected by the external terminal 674. However, the first inductor 671 and the second inductor 672 are disposed, so that the high frequency component corresponding to the modulation signal does not flow between the metal film 643P and the metal film 643N. Thus, a path of the modulation signal does not include a heterojunction interface between the Si layer 120 and the Ge layer 130. Thus, in the sixth embodiment, a reduction in response characteristics such as those occurring in a heterojunction PD can be avoided. Moreover, the structure of the sixth embodiment can further enhance the electric field intensity between the p-type Si region 321 and the n-type Si region 322, thereby increasing the operation speed.

Figure 50:
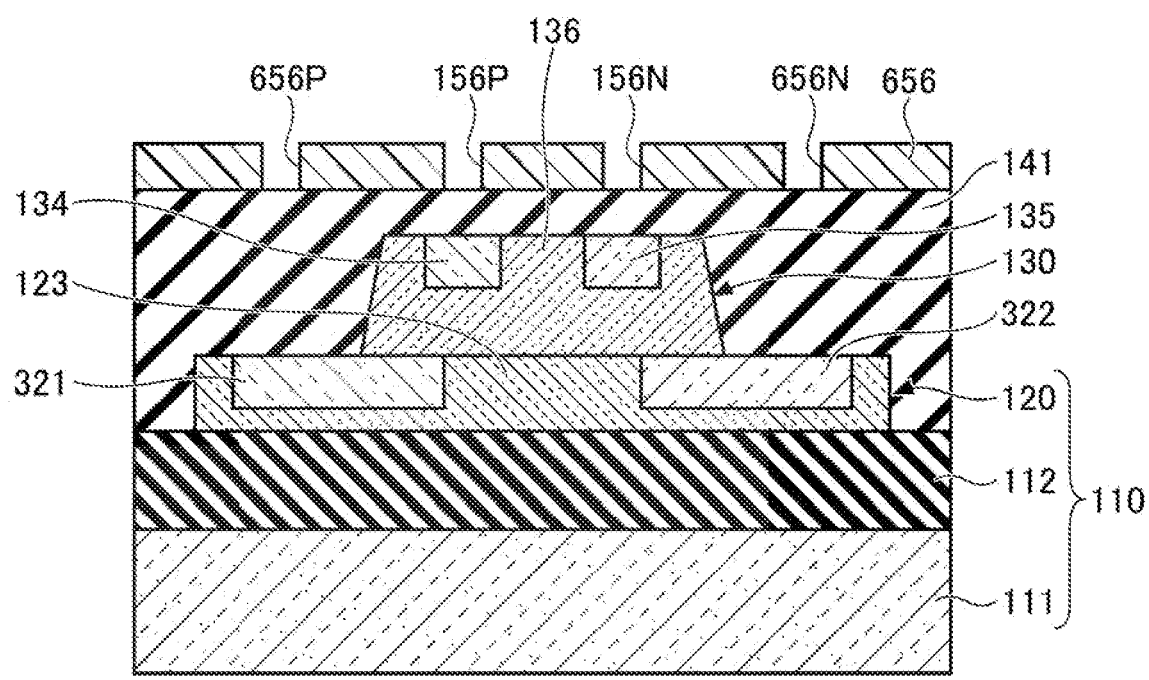
FIG. 50 is a cross-sectional view (1) illustrating a method for fabricating a semiconductor photodetector according to the sixth embodiment.
Figure 51:
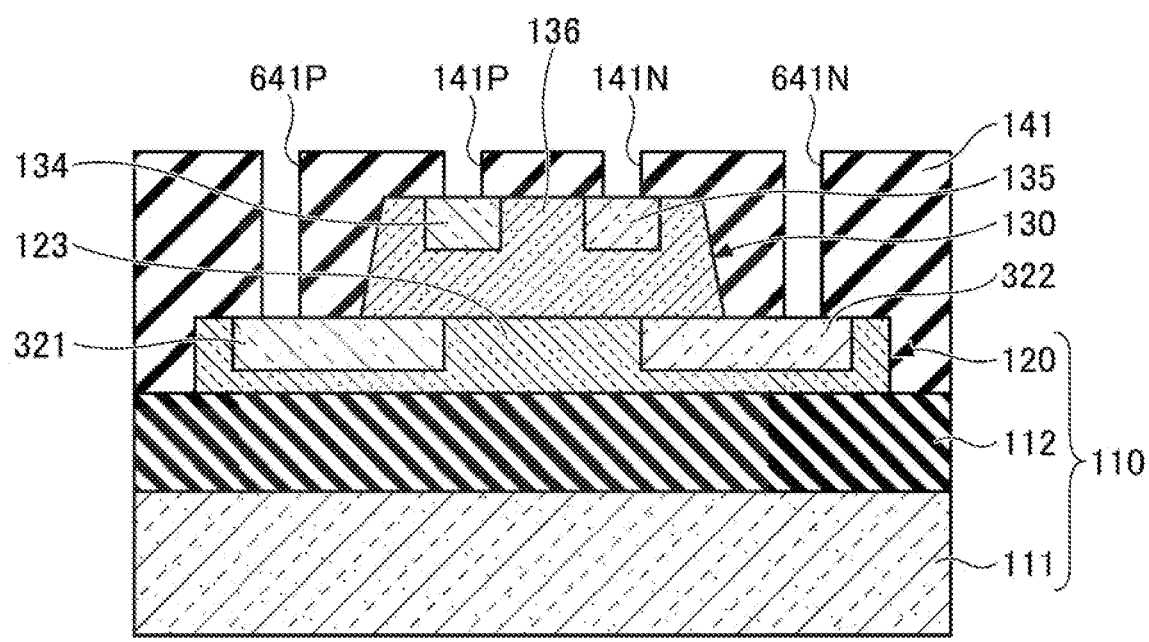
FIG. 51 is a cross-sectional view (2) illustrating the method for fabricating a semiconductor photodetector according to the sixth embodiment.
Figure 52:
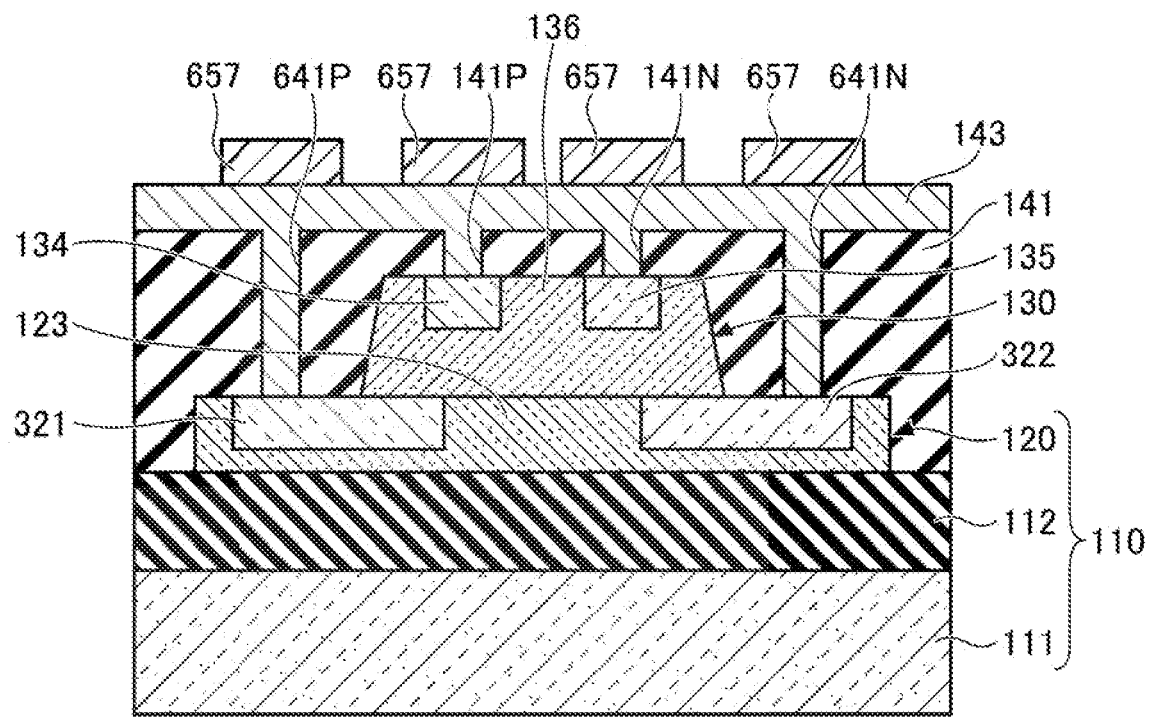
FIG. 52 is a cross-sectional view (3) illustrating the method for fabricating a semiconductor photodetector according to the sixth embodiment.

Next, a method for fabricating the semiconductor photodetector 600 according to the sixth embodiment will be described. FIGS. 50 to 52 are cross-sectional views illustrating a method for fabricating a semiconductor photodetector 600 according to the sixth embodiment.

First, as in the first embodiment, the process up to the formation of the Si oxide film 141 is performed (see FIG. 37). Note that the p-type Si region 321 can be formed by differentiating a position and a shape of the opening 151P of the photoresist mask 151, and the n-type Si region 322 can be formed by differentiating a position and a shape of the opening 152N of the photoresist mask 152. Subsequently, as illustrated in FIG. 50, a photoresist mask 656 is formed on the Si oxide film 141, where the photoresist mask 656 includes an opening 156P that opens a region intended to form the opening 141P, an opening 156N that opens a region intended to form the opening 141N, an opening 656P that opens a region intended to form the opening 641P, and an opening 656N that opens a region intended to form the opening 641N. The photoresist mask 656 can be formed by coating, exposing, and developing a photoresist agent.

Then, as illustrated in FIG. 51, the opening 141P reaching the p-type Ge region 134, the opening 141N reaching the n-type Ge region 135, the opening 641P reaching the p-type Si region 321, and the opening 641N reaching the n-type Si region 322 are formed in the Si oxide film 141. The openings 141P, 141N, 641P and 641N can be formed, for example, by dry etching. The photoresist mask 656 is then removed.

The opening 141P, the opening 141N, the opening 641P, and the opening 641N are then filled to form a metal film 143 on the Si oxide film 141, as illustrated in FIG. 52. As the metal film 143, for example, an aluminum film is formed by the sputtering process. Thereafter, a photoresist mask 657 is formed to cover a region intended to form the metal film 143P, a region intended to form the metal film 143N, a region intended to form the metal film 643P, and a region intended to form the metal film 643N. The photoresist mask 657 can be formed by coating, exposing, and developing a photoresist agent.

The metal film 143 is then dry etched to form a metal film 143P, a metal film 143N, a metal film 643P, and a metal film 643N. The photoresist mask 657 is then removed (see FIG. 49).

The semiconductor photodetector 600 according to the sixth embodiment can be fabricated in this manner.

The semiconductor photodetector according to the first to sixth embodiments is suitable for integrated circuits where, for example, a semiconductor device and a semiconductor photodetector that process an electrical signal are integrated on a Si substrate, and high-speed optical communication can be achieved. For example, the semiconductor photodetector according to the first to sixth embodiments is suitable for high-speed optical communication between a central processing unit (CPU) of a computer and a memory, or for high-speed optical communication between CPUs. It is particularly promising for next-generation high-capacity optical interconnect applications. It is also promising for coherent communication applications used for long distance mass communication.

Note that, in the present disclosure, the materials of the first and second semiconductor layers are not limited to Si and Ge. For example, a $Si_xGe_{1-x}$ layer ($0 \leq x < 1$) or a $Ge_{1-x}Sn_x$ layer ($0 \leq x < 1$) may be used as the second semiconductor layer.

Seventh Embodiment

Figure 53:
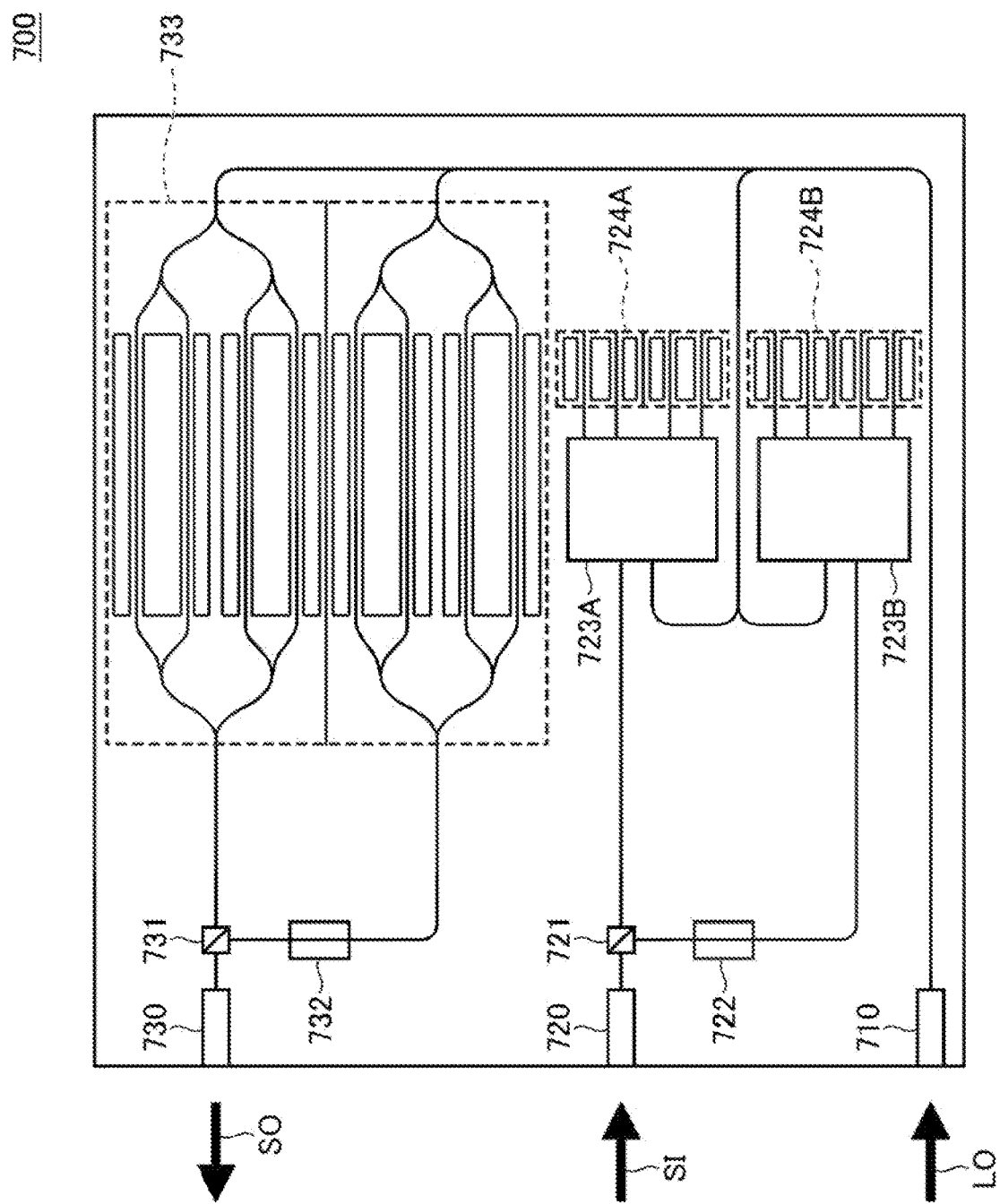
FIG. 53 is a block diagram illustrating a configuration of a Si photonic coherent integrated device according to a seventh embodiment.

Next, a seventh embodiment will be described. The seventh embodiment relates to a Si photonic coherent integrated device, which is an example of an integrated optical device including a semiconductor photodetector. FIG. 53 is a block diagram illustrating a configuration of the Si photonic coherent integrated device according to the seventh embodiment.

As illustrated in FIG. 53, the Si photonic coherent integrated device 700 according to the seventh embodiment includes an input unit 710 configured to receive local light emission LO, an input unit 720 configured to receive a signal light SI, and an output unit 730 configured to output a signal light SO to be transmitted.

A Si photonic coherent integrated device 700 has a polarization splitter element 721 connected to the input unit 720, two mixers 723A and 723B connected to the polarization splitter element 721, and a polarization rotation element 722 connected between the polarization splitter element 721 and the mixer 723B. The Si photonic coherent integrated device 700 further includes a photodetector 724A configured to convert an optical signal output by the mixer 723A into an electrical signal, and a photodetector 724B configured to convert an optical signal output by the mixer 723B into an electrical signal. Each of the photodetectors 724A and 724B includes a plurality of semiconductor photodetectors having the same configuration as those of the semiconductor photodetectors according to any of the first to sixth embodiments. The mixers 723A and 723B also receive local light emission LO input to the input unit 710.

The Si photonic coherent integrated device 700 has a polarization multiplex element 731 connected to the output unit 730, a silicon IQ modulator 733 connected to the polarization multiplex element 731, and a polarization rotation element 732 provided in a waveguide of a Q signal output from the silicon IQ modulator 733. A part of the local light emission LO input is introduced to the silicon IQ modulator 733 through the input unit 710.

In an optical transmission apparatus according to the seventh embodiment, each of the photodetectors 724A and 724B includes the semiconductor photodetectors having the same configuration as that of the semiconductor photodetectors according to any one of the first to sixth embodiments.

According to the present disclosure, a high operating speed and a high optical responsivity can be achieved simultaneously.

Although the preferred embodiments have been described in detail above, various modifications and substitutions can be made to the above-described embodiments without departing from the scope of the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor photodetector comprising:
a first semiconductor layer having a first refractive index and a first band gap;
a second semiconductor layer formed on the first semiconductor layer, the second semiconductor layer having a second refractive index and a second band gap;
a first electrode; and
a second electrode,
wherein the second refractive index is greater than the first refractive index, and
the second band gap is smaller than the first band gap, wherein
the first semiconductor layer includes
a p-type first region,
an n-type second region, and
a non-conductive third region between the first region and the second region, and
the second semiconductor layer includes
a p-type fourth region in ohmic contact with the first electrode,
an n-type fifth region in ohmic contact with the second electrode, and
a non-conductive sixth region between the fourth region and the fifth region, and wherein
the first region is located more toward the first direction in viewing from the third region,
the second region is located more toward a second direction opposite to the first direction in viewing from the third region,
the fourth region is located more toward the first direction in viewing from the sixth region,
the fifth region is located more toward the second direction in viewing from the sixth region, the third region and the sixth region overlap each other in a plan view,
the fourth region and the fifth region are separated in a thickness direction from the first semiconductor layer, and
the sixth region is located between the fourth region and the first semiconductor layer and is located between the fifth region and the first semiconductor layer.

2. The semiconductor photodetector according to claim 1, wherein
a thickness of the fourth region and a thickness of the fifth region are less than or equal to one-half a thickness of the second semiconductor layer.

3. The semiconductor photodetector according to claim 1, wherein
a recess is formed in a region of the first semiconductor layer, the region being in contact with the second semiconductor layer.

4. The semiconductor photodetector according to claim 1, wherein
in a plan view,
each of the first region, the second region, the fourth region, and the fifth region has a first edge and a second edge, the first edge being located toward the first direction and the second edge being located toward the second direction, and wherein
in a plan view,
the second edge of the first region is located more toward the first direction relative to the second edge of the fourth region, and
the first edge of the second region is located more toward the second direction relative to the first edge of the fifth region.

5. The semiconductor photodetector according to claim 1, wherein
in a plan view,
the first region is separated from the fourth region in the first direction, and the second region is separated from the fifth region in the second direction.

6. The semiconductor photodetector according to claim 1, wherein
the first semiconductor layer is a Si layer, and
the second semiconductor layer is a $Si_xGe_{1-x}$ layer (0≤x<1).

7. The semiconductor photodetector according to claim 1, wherein
the first semiconductor layer is a Si layer, and
the second semiconductor layer is a $Ge_{1-x}Sn_x$ layer (0≤x<1).

8. The semiconductor photodetector according to claim 1, further comprising:
a photoelectric converter portion having the first semiconductor layer and the second semiconductor, the first semiconductor layer and the second semiconductor overlapping with each other in a plan view; and
a light introduction portion connected to the photoelectric converter portion, wherein
a propagation direction of light guided from the light introduction portion to the photoelectric converter portion is perpendicular to the first direction and the second direction.

9. The semiconductor photodetector according to claim 1, further comprising:
a third electrode in ohmic contact with the first region; and
a fourth electrode in ohmic contact with the second region.

10. A receiver comprising:
the semiconductor photodetector according to claim 9; and
a circuit configured to apply a first voltage to the third electrode and to apply a second voltage to the fourth electrode, the second voltage being lower than the first voltage.

11. The receiver according to claim 10, wherein
the circuit includes
a first inductor connected between the first electrode and the third electrode,
a second inductor connected between the second electrode and the fourth electrode, and
a DC power supply connected between the first electrode and the second electrode.

12. An integrated optical device comprising:
the semiconductor photodetector according to claim 1.

13. The semiconductor photodetector according to claim 1, wherein
the sixth region is in contact with the first semiconductor layer.

14. The semiconductor photodetector according to claim 1, wherein
the fourth region is located between the first electrode and the sixth region, and the fifth region is located between the second electrode and the sixth region.

15. A semiconductor photodetector comprising:
a first semiconductor layer having a first refractive index and a first band gap;
a second semiconductor layer formed on the first semiconductor layer, the second semiconductor layer having a second refractive index and a second band gap;
a first electrode; and
a second electrode,
wherein the second refractive index is greater than the first refractive index, and
the second band gap is smaller than the first band gap,
wherein the first semiconductor layer includes
a p-type first region,
an n-type second region, and
a non-conductive third region between the first region and the second region, and
the second semiconductor layer includes
a p-type fourth region in ohmic contact with the first electrode,
an n-type fifth region in ohmic contact with the second electrode, and
a non-conductive sixth region between the fourth region and the fifth region,
wherein the first region is located more toward the first direction in viewing from the third region,
the second region is located more toward a second direction opposite to the first direction in viewing from the third region,
the fourth region is located more toward the first direction in viewing from the sixth region,
the fifth region is located more toward the second direction in viewing from the sixth region, and
the third region and the sixth region overlap each other in a plan view,
wherein in a plan view,
each of the first region, the second region, the fourth region, and the fifth region has a first edge and a second edge, the first edge being located toward the first direction and the second edge being located toward the second direction, and wherein in a plan view,
the second edge of the first region is located more toward the first direction relative to the second edge of the fourth region, and
the first edge of the second region is located more toward the second direction relative to the first edge of the fifth region.

16. A receiver comprising:
a semiconductor photodetector; and
a circuit configured to apply a first voltage to the third electrode and to apply a second voltage to the fourth electrode, the second voltage being lower than the first voltage,
wherein the semiconductor photodetector includes:
   a first semiconductor layer having a first refractive index and a first band gap;
   a second semiconductor layer formed on the first semiconductor layer, the second semiconductor layer having a second refractive index and a second band gap;
   a first electrode; and
   a second electrode,
wherein the second refractive index is greater than the first refractive index, and the second band gap is smaller than the first band gap,
wherein the first semiconductor layer includes
   a p-type first region,
   an n-type second region, and
   a non-conductive third region between the first region and the second region, and
the second semiconductor layer includes
   a p-type fourth region in ohmic contact with the first electrode,
   an n-type fifth region in ohmic contact with the second electrode, and
   a non-conductive sixth region between the fourth region and the fifth region,
wherein the first region is located more toward the first direction in viewing from the third region,
the second region is located more toward a second direction opposite to the first direction in viewing from the third region,
the fourth region is located more toward the first direction in viewing from the sixth region,
the fifth region is located more toward the second direction in viewing from the sixth region, and
the third region and the sixth region overlap each other in a plan view, wherein the semiconductor photodetector, further includes:
a third electrode in ohmic contact with the first region; and
a fourth electrode in ohmic contact with the second region, and
wherein the circuit includes
   a first inductor connected between the first electrode and the third electrode,
a second inductor connected between the second electrode and the fourth electrode, and
   a DC power supply connected between the first electrode and the second electrode.

* * * * *